(12) United States Patent
Hanamachi et al.

(10) Patent No.: US 12,284,731 B2
(45) Date of Patent: Apr. 22, 2025

(54) HEATER AND STAGE HAVING THE HEATER

(71) Applicant: NHK SPRING CO., LTD., Yokohama (JP)

(72) Inventors: Toshihiko Hanamachi, Yokohama (JP); Arata Tatsumi, Yokohama (JP); Kenji Sekiya, Yokohama (JP); Naoya Aikawa, Yokohama (JP); Masaya Takanashi, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 1042 days.

(21) Appl. No.: 17/232,519

(22) Filed: Apr. 16, 2021

(65) Prior Publication Data

US 2021/0235550 A1 Jul. 29, 2021

Related U.S. Application Data

(63) Continuation of application No. PCT/JP2019/038711, filed on Oct. 1, 2019.

(30) Foreign Application Priority Data

Oct. 17, 2018 (JP) .................................. 2018-195943

(51) Int. Cl.
*H05B 3/48* (2006.01)
*C23C 14/50* (2006.01)
(Continued)

(52) U.S. Cl.
CPC ............... *H05B 3/48* (2013.01); *C23C 14/50* (2013.01); *C23C 16/4586* (2013.01);
(Continued)

(58) Field of Classification Search
CPC ......... H05B 3/48; C23C 14/50; C23C 14/541; C23C 16/4586; C23C 16/46;
(Continued)

(56) References Cited

U.S. PATENT DOCUMENTS 2,009,980 A * 7/1935 Abbott ..................... H05B 3/06
338/270
3,065,436 A * 11/1962 Kayko .................... F23Q 7/001
29/613

(Continued)

FOREIGN PATENT DOCUMENTS

CN 108430119 A 8/2018
CN 108633113 A 10/2018
(Continued)

OTHER PUBLICATIONS

English translation of Written Opinion issued for corresponding International Patent Application No. PCT/JP2019/038711 on Dec. 17, 2019.
(Continued)

*Primary Examiner* — Eric S Stapleton
(74) *Attorney, Agent, or Firm* — Hauptman Ham, LLP

(57) ABSTRACT

A heater comprises a folded heater wire, a first insulator provided on the folded heater wire, a metal sheath in contact with a part of the first insulator, a first insulating member arranged in parallel to a part of a first end of the folded heater wire taken out from a first end of the metal sheath, a second insulating member arranged in parallel to a part of the first insulating member and parallel to a part of a second end of the folded heater wire taken out from the first end of the metal sheath, a third insulating member arranged in parallel to a part of the first insulating member and the second insulating member, and bundle the first insulating member and the second insulating member, and a cylindrical member
(Continued)

arranged in parallel to a part of the metal sheath and the third insulating member.

15 Claims, 28 Drawing Sheets

(51) Int. Cl.
    *C23C 16/458*     (2006.01)
    *C23C 16/46*     (2006.01)
    *H01J 37/32*     (2006.01)
    *H01L 21/67*     (2006.01)

(52) U.S. Cl.
    CPC ........ *C23C 16/46* (2013.01); *H01J 37/32724* (2013.01); *H01L 21/67103* (2013.01); *H01J 2237/334* (2013.01); *H01L 21/67069* (2013.01)

(58) Field of Classification Search
    CPC .......... H01L 21/67103; H01L 21/67069; H01J 37/32724; H01J 2237/334
    USPC ........................................................ 219/534
    See application file for complete search history.

(56) References Cited

U.S. PATENT DOCUMENTS

| | | | | | |
|---|---|---|---|---|---|
| 3,087,134 | A * | 4/1963 | McOrlly | ................ | H05B 3/48 338/273 |
| 3,839,623 | A * | 10/1974 | Portmann | ................ | H05B 3/06 219/544 |
| 5,835,679 | A * | 11/1998 | Eckman | ................ | H05B 3/48 338/286 |
| 5,844,205 | A * | 12/1998 | White | ................ | C30B 25/12 219/390 |
| 5,930,459 | A * | 7/1999 | Eckman | ................ | H05B 3/82 219/544 |
| 6,180,931 | B1 * | 1/2001 | Futakuchiya | ......... | H05B 3/283 219/544 |
| 2004/0173601 | A1 * | 9/2004 | Lutz | ................ | H05B 3/50 219/544 |
| 2015/0114949 | A1 * | 4/2015 | Lee | ................ | H05B 3/48 219/534 |
| 2016/0014844 | A1 * | 1/2016 | Schlipf | ................ | H05B 3/50 219/544 |
| 2016/0079101 | A1 * | 3/2016 | Yanai | ................ | H01L 21/67109 438/706 |
| 2018/0235033 | A1 * | 8/2018 | Schlipf | ................ | H05B 3/40 |
| 2019/0098704 | A1 * | 3/2019 | Schlipf | ................ | H01B 7/16 |
| 2020/0045779 | A1 * | 2/2020 | Hanamachi | ........... | H05B 3/10 |

FOREIGN PATENT DOCUMENTS

| | | | | |
|---|---|---|---|---|
| EP | 0848209 | A2 * | 6/1998 | ............. H05B 3/141 |
| FR | 2 608 884 | A1 | 6/1988 | |
| JP | S54-83648 | U | 6/1979 | |
| JP | S54-126146 | U | 9/1979 | |
| JP | S57-202093 | A | 12/1982 | |
| JP | S61-181091 | A | 8/1986 | |
| JP | 3040731 | U | 8/1997 | |
| JP | 2009-091660 | A | 4/2009 | |
| JP | 2014-222651 | A | 11/2014 | |
| TW | 496098 | B | 7/2002 | |
| TW | 201838476 | A | 10/2018 | |

OTHER PUBLICATIONS

Office Action issued on Nov. 8, 2022, for corresponding Chinese patent application No. 201980066496.3, along with an English translation (13 pages).

Office Action issued on Jul. 19, 2022 for corresponding Japanese Patent Application No. 2018-195943, along with an English machine translation.

Office Action issued on Dec. 13, 2022 for corresponding Japanese Patent Application No. 2018-195943, along with an English machine translation (12 pages).

Office Action issued on Sep. 13, 2022 for corresponding Korean Patent Application No. 10-2021-7010896, along with an English machine translation (11 pages).

Office Action issued on Dec. 13, 2022 for corresponding Japanese Patent Application No. 2018-1958943, along with an English machine translation (12 pages).

International Search Report issued for corresponding International Patent Application No. PCT/JP2019/038711 on Dec. 17, 2019, along with an English translation.

Written Opinion issued for corresponding International Patent Application No. PCT/JP2019/038711 on Dec. 17, 2019.

Office Action issued for corresponding Taiwanese Patent Application No. 108136071 on Nov. 26, 2020, along with an English translation.

Extended European Search Report issued on May 23, 2022, for corresponding European Patent Application No. 1 19873637.3.

* cited by examiner

HEATER AND STAGE HAVING THE HEATER

CROSS-REFERENCE TO RELATED APPLICATIONS

This application is based upon and claims the benefit of priority from the prior Japanese Patent Application No. 2018-195943 filed on Oct. 17, 2018, and the PCT Application No. PCT/JP2019/038711, filed on Oct. 1, 2019, the entire contents of which are hereby incorporated by reference.

FIELD

The present invention relates to a heater and a stage having the heater.

BACKGROUND

A semiconductor device is installed in almost all electronic devices and has an important role for their functions. A semiconductor device utilizes the semiconductor properties of silicon, etc. A semiconductor device is composed by laminating semiconductor films, insulating films, and conductive films over a substrate, followed by patterning these films. These films are deposited by an evaporation method, a sputtering method, a chemical vapor deposition (CVD) method, or chemical reactions of the substrate and are patterned with a photolithography process. A photolithography process includes formation of a resist film over a film to be patterned, formation of a resist mask by light exposure and development of the resist film, partial removal of the film with etching, and removal of the resist mask.

The properties of these films are strongly influenced by the conditions when the films are formed or patterned. One of the conditions is the temperature of the substrate. In many cases, the temperature of the substrate is controlled by adjusting the temperature of a supporting stage (hereinafter, referred to as a stage) for supporting a substrate. A sheath heater is frequently used as a heater for heating the stage in order to uniformly heat the substrate and suppress temperature variation in the substrate. For example, Japanese Patent Application Publication No. 2009-91660 discloses a stage having a plurality of sheath heaters in which an electric heating wire (heater wire) is provided in a metal sheath.

SUMMARY

An object of an embodiment of the present invention is a heater including: a folded heater wire; a first insulator provided on the folded heater wire; a metal sheath to be in contact with at least a part of the first insulator; a first insulating member arranged in parallel to at least a part of a first end of the folded heater wire taken out from a first end of the metal sheath; a second insulating member arranged in parallel to at least a part of the first insulating member and arranged in parallel to at least a part of a second end of the folded heater wire taken out from the first end part of the metal sheath; a third insulating member arranged in parallel to at least a part of the first insulating member and a part of the second insulating member and arranged to bundle the first insulating member and the second insulating member; and a cylindrical member arranged in parallel to at least a portion of the metal sheath and a portion of the third insulating member.

DESCRIPTION OF EMBODIMENTS

Figure 1A:
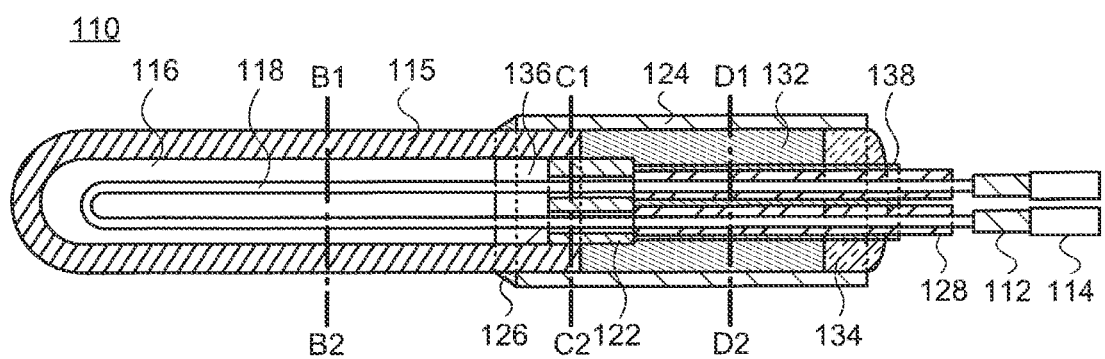
FIG. 1A is a cross-sectional view showing a configuration of a heater according to an embodiment of the present invention.

Hereinafter, each embodiment of the present invention is explained with reference to the drawings. However, the present invention can be implemented in a variety of different modes within its concept and should not be interpreted only within the disclosure of the following embodiments exemplified.

For the sake of clarity of description, the drawings may be schematically represented with respect to width, thickness, shape, and the like compared with actual modes, but they are merely an example and do not limit the interpretation of the present invention. In addition, in the specification and each drawing, the same reference number is provided to an element that is the same as that which appears in preceding drawings, and a detailed explanation may be omitted as appropriate. Further, although an explanation may be provided using the phrase upward or downward for convenience of explanation, upward or downward each indicates the direction when using the heater unit (when mounting a substrate).

In this specification and drawings, the same reference numeral is used when the same or similar structures are collectively expressed, while a small letter is further added thereto when these structures are distinctively expressed. When a plurality of portions in a single structure is distinctively expressed, the same reference numeral is used and a hyphen and a natural number are further added.

In order to improve the uniformity of the temperature distribution in the substrate, a stage provided with a heater at a high density is required. Further, in order to provide a heater with high density on the stage, it is a problem to reduce the diameter of the heater. Furthermore, the diameter reduction of the heater requires improvement of the reliability of the heater with a reduced diameter in order to avoid damage of the heater and disconnection of a heat-generating wire.

Accordingly, one of the objects of the present disclosure is to provide a sheath heater with improved reliability and a reduced diameter. Another object is to provide a stage with a heater for precisely controlling a temperature of a substrate.

In some of the embodiments described below, a sheath heater with improved reliability and a reduced diameter as well as a stage with the sheath heater for precisely controlling the temperature of the substrate are illustratively represented.

1. First Embodiment

In the present embodiment, a sheath heater 110 according to an embodiment of the present invention is explained.

1-1. Configuration of the Sheath Heater

Figure 1B:
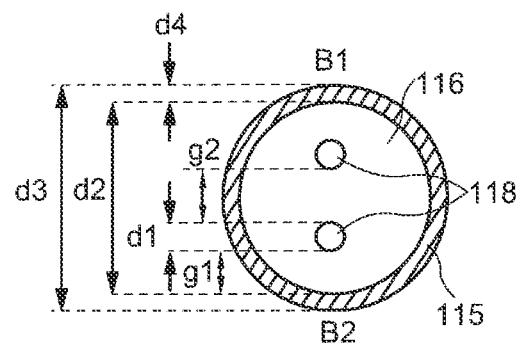
FIG. 1B is a cross-sectional view showing a configuration of a heater according to an embodiment of the present invention.
Figure 1C:
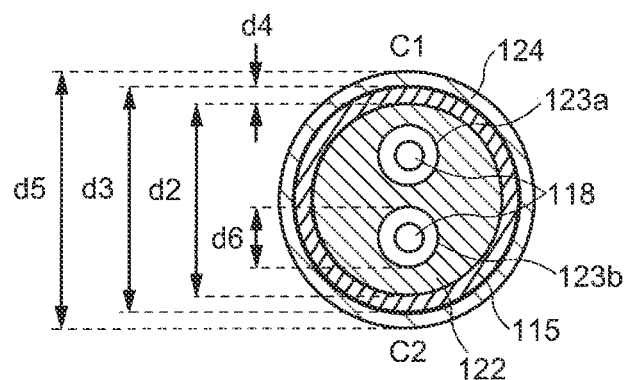
FIG. 1C is a cross-sectional view showing a configuration of a heater according to an embodiment of the present invention.
Figure 1D:
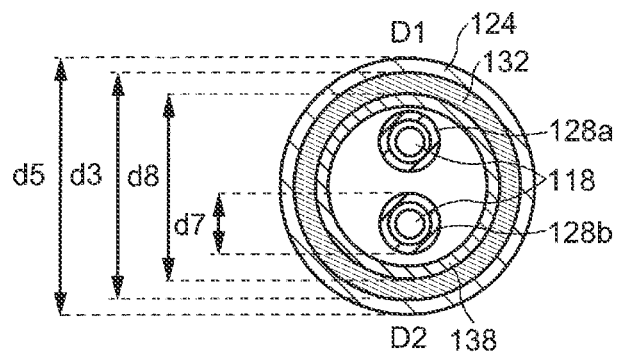
FIG. 1D is a cross-sectional view showing a configuration of a heater according to an embodiment of the present invention.

FIG. 1A to 1D are each a cross-sectional view of the sheath heater 110. FIG. 1A is a cross-sectional view showing the configuration of the sheath heater 110. FIG. 1B is a cross-sectional view showing the configuration along a chain line B1-B2. FIG. 1C is a cross-sectional view showing the configuration along a chain line C1-C2. FIG. 1D is a cross-sectional view showing the configuration along a chain line D1-D2.

The sheath heater 110 has a function of generating heat by energizing. The sheath heater 110 is provided to heat a second support plate 104 (reference FIG. 5A) and a first support plate 102 (see FIG. 5A) of the stage 100 (see FIG. 5A). With this structure, the substrate placed on the stage 100 can be heated.

As shown in FIG. 1A, the sheath heater 110 includes a metal sheath 115, a heater wire 118, a first insulator 116, a second insulator 136, a first insulating member 122, a connection member 126, a cylindrical member 124, a second insulating member 128, a third insulating member 138, a third insulator 132, a fourth insulator 134, a pair of lead wires 112, and a pair of terminals 114. In FIG. 1A, the sheath heater 110 of a mono-terminal type is exemplified. In this specification and the like, the configuration of the sheath heater 110 according to the embodiment of the present invention is explained using the sheath heater 110 of the mono-terminal type as an example. However, the same configuration as the sheath heater 110 according to the embodiment of the present invention may be applied to a bi-terminal type sheath heater. In a planar view of FIG. 1A, the right side is referred to as the upper part, and the left side is referred to as the lower part.

The metal sheath 115 has a cylindrical shape in which its first end portion (closed end) is closed and its second end portion (open end) is opened. In the present specification and the like, an example is demonstrated in which the shape of an end of the metal sheath 115 has a semicircular shape. However, the shape is not limited to this example. For example, the shape of the end of the metal sheath 115 may be a planar shape or a conical shape. The shape may be any shape as long as the second support plate 104 and the first support plate 102 (see FIG. 5A) which will be described later (see FIG. 5A) can be heated by the heat generation of the sheath heater 110.

The heater wire 118 is folded in the metal sheath 115 and is arranged to reciprocate in the cylindrical axial direction of the metal sheath 115, both ends of which are taken out from the second end portion (open end) of the metal sheath 115. That is, one heater wire 118 is arranged so as to have two axes (two cores) in most of the cylindrical axial direction of the metal sheath 115, and one of the two axes, its terminal, the other of the two axes and its terminal are taken out from the second end portion of the metal sheath 115 (open end). Further, one and the other of the two axes of one heater wire 118 are arranged so as to be substantially parallel or parallel to the cylindrical axial direction of the metal sheath 115. At least a portion of one of the two axes of one heater wire 118 and at least a portion of the other of the two axes may be arranged so as to be substantially parallel or parallel to the cylindrical axial direction of the metal sheath 115. Further, heater wire 118 is arranged with a gap in the metal sheath 115. Note that the heater wire 118 includes a heat-generating wire and a non-heat-generating wire.

The heater wire 118 and the metal sheath 115 are insulated by the first insulator 116 provided in the gap. That is, the heater wire 118 is surrounded by the first insulator 116, whereas the first insulator 116 is surrounded by a metal sheath 115. The first insulator 116 is provided to fill the metal sheath 115 between the second end portion (open end) and the first end portion (closed end) of the metal sheath 115 and reach the vicinity of the second end portion (open end). The first insulator 116 may be provided in contact with at least a portion of the metal sheath 115, may be provided in contact with at least a portion of the heater wire 118, may be provided to insulate the heater wire 118 and the metal sheath 115 without contact with the metal sheath 115, or may be provided to insulate the heater wire 118 and the metal sheath 115 without contact with the heater wire 118. That is, the first insulator 116 may be provided so as to insulate the heater wire 118 and the metal sheath 115.

At the top of the first insulator 116, a second insulator 136 is provided. The second insulator 136 is provided so as to be in contact with an upper part of the first insulator 116 and at least a part of an inner side of the metal sheath 115. The second insulator 136 allows the first insulator 116 to be sealed within the metal sheath 115 and the heater wire 118 to be fixed within the metal sheath 115. The second insulator 136 may be referred to as a sealant, adhesive, or the like.

At the top of the second insulator 136, a first insulating member 122 is provided. The first insulating member 122 is provided in contact with at least a portion of the top of the second insulator 136 and the inside of the metal sheath 115. The first insulating member 122 has at least a first through hole and a second through hole. One end of the heater wire 118 taken out from the second end portion (open end) of the metal sheath 115 is inserted into the first through hole, and the other is inserted into the second through hole. Therefore, with respect to the first insulating member 122, both ends of the heater wire 118 are inserted from the side where the second insulator 136 is provided and are taken out from the side where the second insulator 136 is not provided. Here, at least a part of the first through hole and at least a part of the second through hole may be provided substantially parallel or parallel to the cylindrical axes of the metal sheaths 115. In addition, at least a part of the heater wire 118 inserted through the first through hole and the second through hole may be provided substantially parallel or parallel to the cylindrical axes of the metal sheaths 115. Further, at least a part of the first through hole and at least a part of the second through hole may be provided substantially parallel or parallel to at least a part of the heater line 118 inserted through the first through hole and the second through hole. The first insulating member 122 may be also referred to as a protective tube, an insulating tube, or the like.

The cylindrical member 124 is provided so that a portion thereof is in contact with the metal sheath 115. The cylindrical member 124 is connected to the metal sheath 115 by a connection member 126. The cylindrical member 124 may consist of a member which has a predetermined thickness and does not have a stair-like step or a stair-like structure. Formation of the cylindrical member with a single member with a predetermined thickness so as not to include a stair-like step or a stair-like structure allows the inner diameter of the cylindrical member 124 and the outer diameter of the metal sheath 115 to be substantially the same. Therefore, the diameter of the sheath heater 110 according to the embodiment of the present invention can be reduced. The cylindrical member 124 may also be referred to as an adaptor.

On the top of the first insulating member 122, two second insulating members 128 are provided in contact with the first insulating member 122. The second insulating members 128 each have a through hole. One end of the heater wire 118 taken out from the first through hole of the first insulating member 122 and is inserted into the first second insulating 128, whereas the other is inserted into the second through hole of the second one. Therefore, with respect to the two second insulating members 128, both ends of the heater wire 118 are inserted from the side where the first insulating member 122 is provided and are taken out from the side where the first insulating 122 is not provided. Here, the two second insulating members 128 may be provided substantially parallel or parallel to the cylindrical axis of the metal sheath 115, and a portion of the two second insulating member 128 may be provided substantially parallel or parallel to the cylindrical axis of the metal sheath 115. Further, the heater wire 118 inserted into the two second insulating members 128 may also be provided substantially parallel to the cylindrical axis of the metal sheath 115, and a portion of the heater wire 118 may be provided substantially parallel or parallel to the cylindrical axis of the metal sheath 115. The outer diameter of the second insulating member 128 is preferred to be smaller than the outer diameter of the first insulating member 122, and the same as the diameters of the first through hole and the second through hole of the first insulating member 122. Furthermore, the length of the second insulating member 128 is larger than the length of the third insulating 138 described below. The length of the second insulating member 128 is a length of the end portion protruding from the end portion where the connection member 126 of the cylindrical member 124 is not provided.

On the top of the first insulating member 122, the third insulating member 138 is provided in contact with the first insulating member 122. The third insulating member 138 has a through hole. Two second insulating members 128 are inserted through the third insulating member 138. Therefore, the third insulating member 138 is inserted into the two second insulating members 128 from the side on which the first insulating member 122 is provided and is taken out from the side on which the first insulating member 122 is not provided. That is, the third insulating member 138 is provided so as to surround at least a portion of the two second insulating members 128. In other words, the third insulating member 138 is provided so as to bundle at least a portion of the two second insulating members 128. Thus, the heater wire 118 is doubly surrounded by the second insulating members and the third insulating member 138. Here, the third insulating member 138 may be provided substantially parallel or parallel to the cylindrical axis of the metal sheath 115, and at least a portion of the third insulating member 138 may be provided substantially parallel or parallel to the cylindrical axis of the metal sheath 115. Further, the outer diameter of the third insulating member 138 is preferably smaller than the outer diameter of the first insulating member 122. The length of the third insulating member 138 is a length of the end portion protruding from the end portion where the connection member 126 of the cylindrical member 124 is not provided. In this specification and the drawings, although an example in which the second insulating members 128 and the third insulating member 138 are not in contact with one another is shown, the present invention is not limited to this example. At least a portion of the outer side (outer wall) of the second insulating member 128 and at least a portion of the inner side (inner wall) of the third insulating member 138 may be in contact with each other. Note that, although an example is demonstrated in this specification where the third insulating member 138 is an insulating member having an insulating property, and the third insulating 138 may have conductivity. The third insulating member 138 may be configured to bundle at least a portion of the two second insulating members 128.

In the cylindrical member 124, the third insulator 132 is provided. The third insulator 132 is provided in contact with a portion of the metal sheath 115, a portion of the first insulating member 122, a portion of the inner wall of the cylindrical member 124, and the third insulating member 138. The third insulator 132 fixes the third insulator member 138 so as to be in contact with the first insulator 122. The third insulator 132 is provided so as to fill the cylinder member 124 up to the vicinity of the end portion where the connection member 126 is not provided. The third insulator 132 may be referred to as a sealant, adhesive, or the like.

On the top of the portion of the third insulation 132, the fourth insulator 134 is provided. The fourth insulator 134 is provided in contact with a portion of the metal sheath 115, a portion of the third insulator 132, a portion of the inner wall of the cylindrical member 124, and the third insulating member 138. The fourth insulator 134 may be referred to as a sealant, adhesive, or the like. The fourth insulator 134 prevents humidity resulting from moisture and a solvent from entering the sheath heater 110. Note that, when the sheath heater 110 is used under an environment that does not require damp proofing, the fourth insulator 134 may not be provided. In the case where the fourth insulator 134 is not provided, it is possible to simplify the manufacturing process of the sheath heater 110.

The second insulating member 128 and the third insulating member 138 are provided to protrude from the fourth insulator 134. Further, both ends of the heater wire 118 are provided to further protrude more than the second insulating member 128 and the third insulating member 138.

At both ends of the heater wire 118, the pair of lead wires 112 is connected. The pair of terminals 114 is connected to the lead wires 112. Note that the pair of terminals 114 may be connected to both ends of the heater wire 118 without the lead wires 112.

As shown in FIG. 1B, FIG. 1C and FIG. 1D, the outer diameter of the heater wire 118 is defined as d1, the inner diameter and the outer diameter of the metal sheath 115 are defined as d2 and d3, respectively, the thickness of the metal sheath 115 is defined as d4, the outer diameter of the cylindrical member 124 is defined as d5, the diameters of the first through hole 123a and the second through hole 123b are defined as d6, the outer diameter of the second insulating member 128a and the second insulating member 128b are defined as d7, the outer diameter of the third insulating member 138 is defined as d8, the distance between the heater wires 118 is defined as g2, and the distance between the outer wall of the heater wire 118 and the inner wall of the metal sheath 115 is defined as g1. Further, the outer diameter of the first insulating member 122 is also d2, and the inner diameter of the cylindrical member 124 is also d3. Note that, FIG. 1B, FIG. 1C and FIG. 1D are cross-sectional views of a cross section perpendicular to the cylindrical shaft. The outer diameter d1 of the heater wire 118 may be selected from the range of 0.1 mm or more and 2.0 mm or less. The inner diameter d2 of the metal sheath 115 may be selected from the range of 3.0 mm or more and 4.0 mm or less, and the outer diameter d3 of the metal sheath 115 may be selected from the range of 3.0 mm or more and 6.0 mm or less, respectively. The thickness d4 of the metal sheath 115 may be selected from the range of 0.5 mm or more and 1.0 mm or less. The distance g1 between the metal sheath 115 and each heater wire 118 provided in the metal sheath 115 may be selected from the range of 0.3 mm or more and 1.0 mm or less or 0.4 mm or more and 1.0 mm or less. The distance g2 between a portion from the folded portion to one end portion of the heater wire 118 and a portion from the folded portion to the other end portion is selected from the range of 0.3 mm or more 2.0 mm or less or 0.4 mm or more 1.0 mm or less. The outer diameter d5 of the cylindrical member 124 may be selected from the range of 4.0 mm or more and 10.0 mm or less. The outer diameter d7 of the second insulating member 128a and the second insulating member 128b may be selected from the range of 1.0 mm or more and 4.5 mm or less. The outer diameter d8 of the third insulating member 138 may be selected from a range of 2.0 mm or more and 9.0 mm or less.

For the heater wire 118, it is possible to use a conductor that generates Joule heat by energizing. Specifically, a metal selected from tungsten, tantalum, molybdenum, platinum, nickel, chromium, and cobalt, or an alloy containing these metals, and the like can be used. Alloys include an alloy of nickel and chromium, and an alloy containing nickel, chromium, and cobalt, and the like.

The first insulator 116 is provided to prevent the heater wire 118 from undergoing a short circuit caused by the contact with the metal sheath 115. The member used for the first insulator 116 may be selected from insulating members having thermal conductivities of 10 W/mK or more and 200 W/mK or less. By using such members, it is possible to transfer the thermal energy generated by the heater wire 118 to the metal sheath 115 efficiently. Examples of the first insulator 116 include magnesium oxide, aluminum oxide, boron nitride, and aluminum nitride.

Metal sheath 115 includes a metal which can be selected from metals having thermal conductivities of 200 W/mK or more and 430 W/mK or less. By selecting such metals, it is possible to transfer the thermal energy generated by the heater wire 118 to the first support plate 102 and the second support plate 104 efficiently. It is preferable that the metal has a thermal expansion coefficient of $5 \times 10^{-6}$/K or more and $25 \times 10^{-6}$/K or less. Thus, it is possible to suppress deformation due to thermal expansion and provide a highly reliable sheath heater 110. Specifically, metals or alloys such as aluminum, titanium, and stainless steel can be used in the metal sheath 115.

As the second insulator 136, for example, a ceramic-based sealant can be used. As the ceramic-based sealant, members containing magnesium oxide, aluminum oxide, aluminum nitride, silicon oxide, silicon carbide, or the like can be used.

The first insulating member 122 is formed from a member including aluminum oxide, zirconium oxide, magnesium oxide, aluminum nitride, silicon oxide, and the like.

Connection member 126 is formed by brazing. Members used as connection member 126 include, for example, an alloy containing silver, copper, and zinc, an alloy containing copper and zinc, copper containing a trace amount of phosphorus, aluminum or its alloy, an alloy containing titanium, copper, and nickel, an alloy containing titanium, zirconium, and copper, an alloy containing titanium, zirconium, copper, and nickel, and the like.

For the cylindrical member 124, members having similar properties as those of the metal sheaths 115 can be used.

The second insulating member 128 and the third insulating member 138 may be insulating tubes formed from, for example, poly (vinyl chloride), silicone rubbers, fluorine-based polymers, polyimides, woven fiberglass, ceramics fibers, or the like.

As the third insulator 132, for example, a ceramic-based adhesive, an epoxy-based adhesive, a glass-based adhesive, or the like can be used. As the ceramic-based adhesive, a member similar to that of the second insulator 136 may be used.

For the fourth insulator 134 may, it is possible to use, for example, a fluorine-based adhesive.

Figure 10A:
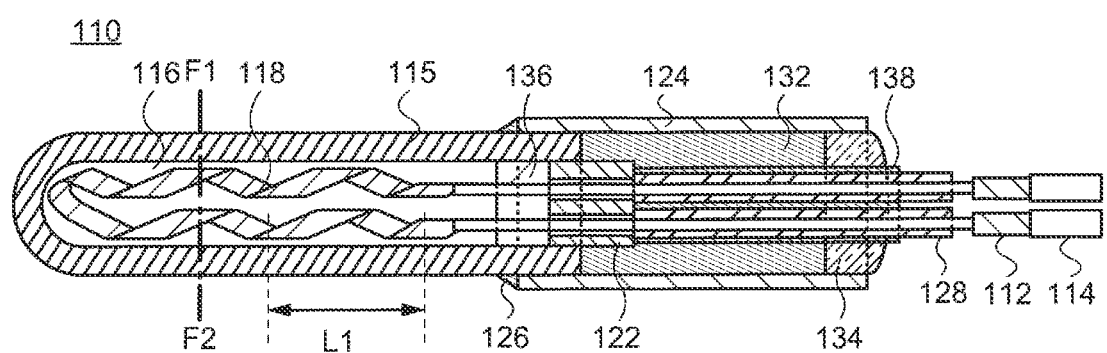
FIG. 10A is a cross-sectional view showing a configuration of a heater according to an embodiment of the present invention.
Figure 10B:
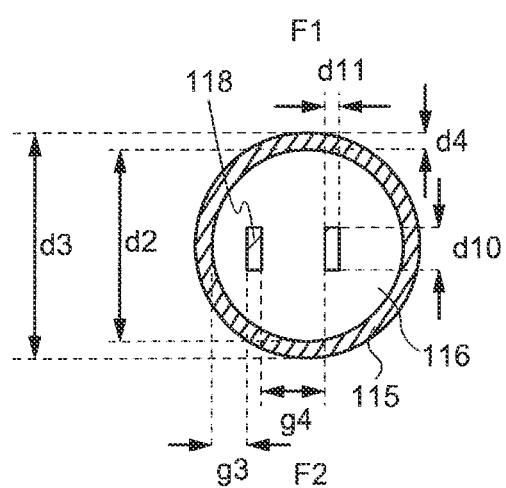
FIG. 10B is a cross-sectional view showing a configuration of a heater according to an embodiment of the present invention.
Figure 11A:
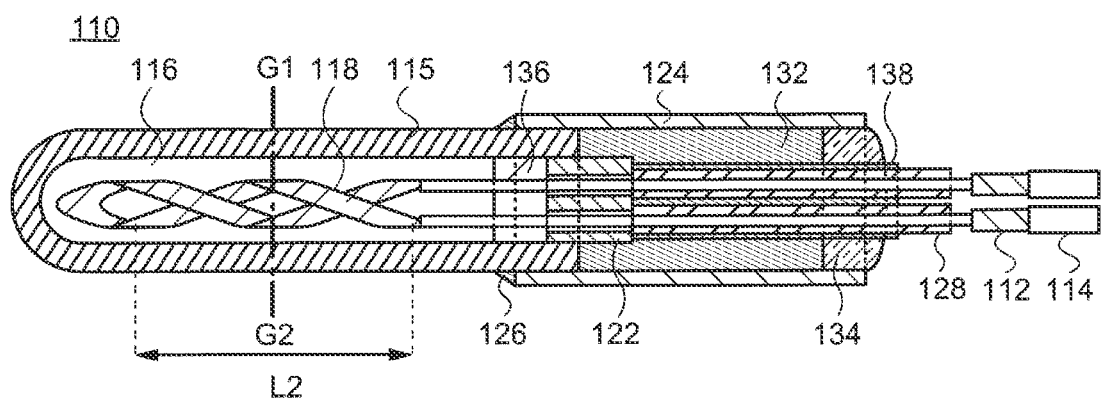
FIG. 11A is a cross-sectional view showing a configuration of a heater according to an embodiment of the present invention.
Figure 11B:
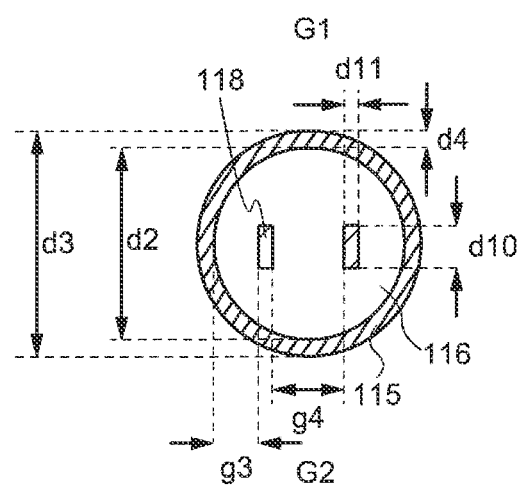
FIG. 11B is a cross-sectional view showing a configuration of a heater according to an embodiment of the present invention.

There is no limitation to the shape of the cross section perpendicular to the cylindrical axis of the sheath heater 110, and it is possible to use a sheath heater 110 having various structures. For example, the shape may be a circular shape as shown in FIG. 1B, may be a polygonal shape as shown in FIG. 10B and FIG. 11B described below, and may be an elliptical shape although it is not illustrated. In the case where the cross-sectional shape is circular, since the force required for deformation does not depend on the direction of bending, it is possible to readily bend the sheath heater 110 in any arbitral direction. Therefore, it is possible to readily arrange the sheath heater 110 in a groove formed on the first support plate 102 or the second support plate 104 described below.

A conventional sheath heater has a structure, for example, in which an insulating member such as an insulating tube is connected to a pair of heater wires taken out from the open end of the metal sheath in order to separate the distance between one heater wire and the other heater wire and maintain the distance therebetween. In addition, lead wires are connected to each of the heater wires, and the pair of lead wires is bundled with the insulating members such as an insulating tube. At least a portion of such a structure is referred to as a fastener. Moreover, the conventional sheath heater has a structure in which the structure described above is, for example, inserted into a stair-like cylindrical member having two steps, and the stair-like cylindrical member having two steps and the metal sheath are connected by brazing. Therefore, the conventional sheath heater is a heater having a thick diameter at least due to the fastener and the stair-like cylindrical member.

On the other hand, the sheath heater according to an embodiment of the present invention does not include a fastener and a stair-like stepped cylindrical member included in the conventional sheath heater. As described above, the sheath heater 110 according to an embodiment of the present invention has a structure in which the pair of heater wires 118 taken out from the open end of the metal sheath 115 is surrounded by the second insulating member 128 which is thinner than the outer diameter of the metal sheath 115 and by the third insulating member 138 which is thinner than the outer diameter of the metal sheath 115 and is further surrounded by the cylindrical member 124 which has a similar outer diameter as the metal sheath 115. Therefore, the sheath heater 110 can be formed thinner. Further, it is possible to not only ensure the insulation between the metal sheath 115 and the heater wire 118 but also prevent a short circuit of the heater wire 118. The sheath heater 110 can be laid out at a high density on the stage 100 described below. Therefore, the temperature of the substrate can be made uniform, and the temperature distribution of the substrate can be further reduced.

1-2. Fabrication of the Sheath Heater

FIG. 2A to FIG. 3C are cross-sectional views showing the fabrication methods of the sheath heater 110. FIG. 4 is a diagram showing a flowchart for explaining a method of fabricating the sheath heater 110. Here, the fabrication of the sheath heater is explained referring to FIG. 1A and FIG. 2 to FIG. 4. Note that, in planar views of FIG. 1A and FIGS. 2A to FIG. 3C, the right side is referred to as the upper part, while the left side as the lower part.

Figure 2A:
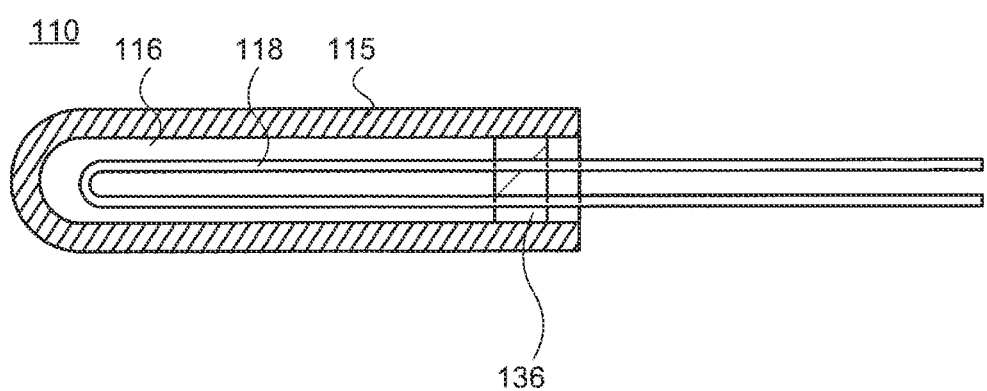
FIG. 2A is a cross-sectional view showing a method for fabricating a heater according to an embodiment of the present invention.
Figure 2B:
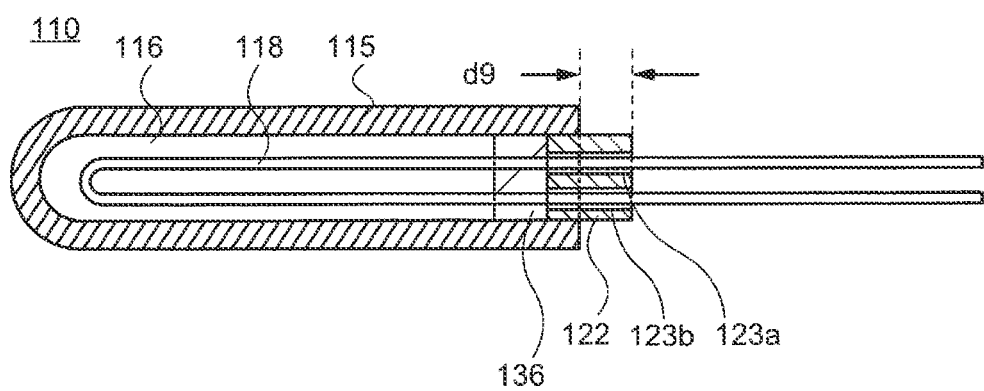
FIG. 2B is a cross-sectional view showing method for fabricating a heater according to an embodiment of the present invention.

As shown in FIG. 2A and step 31 (S31) of FIG. 4, when the fabrication of the sheath heater 110 is started, the second insulator 136 is injected into the metal sheath 115 surrounding the first insulator 116 and the heater wire 118. In the present embodiment, as the second insulator 136, a ceramic sealing agent is used. Here, the heater wire 118 is folded within the metal sheath 115, and both ends thereof are taken out from one end of the metal sheath 115. The length of the pair of heater wires 118 taken out from one end of the metal sheath 115 is sufficiently longer than the length of the metal sheath 115.

Next, as shown in FIG. 2A and step 33 (S33) of FIG. 4, both ends of the heater wire 118 taken out from one end of the metal sheath 115 are inserted into the first insulating member 122. More specifically, one of both ends of the heater wire 118 is inserted into the first through hole 123a included in the first insulating member 122, and the other one of both ends of the heater wire 118 is inserted into the second through hole 123b included in the first insulating member 122. In the present embodiment, as the first insulating member 122, a ceramic-based insulating tube having two through holes is used. At this time, the length d9 of the first insulating member 122 protruding from the metal sheath 115 may be measured. It is possible to confirm whether or not the heater wire 118 is inserted into the first insulating member 122 and whether or not the first insulating member 122 is properly provided in the metal sheath 115 by measuring the length d9.

Figure 2C:
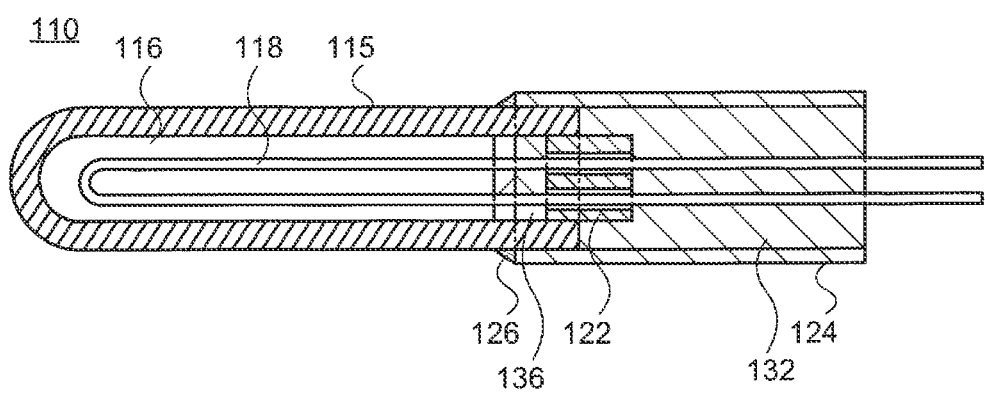
FIG. 2C is a cross-sectional view showing a method for fabricating a heater according to an embodiment of the present invention.

Next, as shown in FIG. 2C and step 35 (S35) of FIG. 4, the metal sheath 115 is inserted into the cylindrical member 124, and the metal sheet 115 and the cylindrical member 124 are connected with the connection member 126. In the present embodiment, the metal sheath 115 and the cylindrical member 124 are connected to each other by silver brazing using silver as the connection member 126. In addition, in the present embodiment the cylindrical member 124 is formed of a member which contains an aluminum member, where the outer diameter d5 of the cylindrical member 124 is approximately 6.5 mm, the inner diameter d3 of the cylindrical member 124 is approximately 4.5 mm, and the thickness of the cylindrical member 124 is approximately 1.0 mm.

Figure 3A:
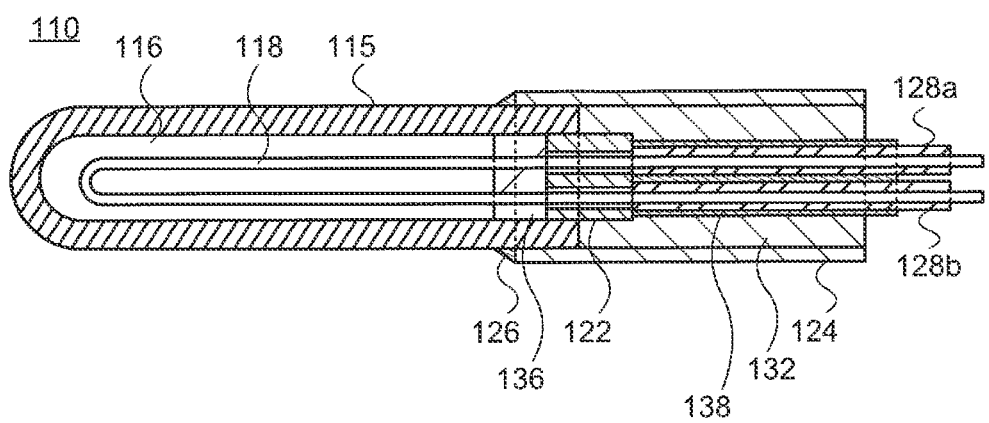
FIG. 3A is a cross-sectional view showing a method for fabricating a heater according to an embodiment of the present invention.
Figure 4:
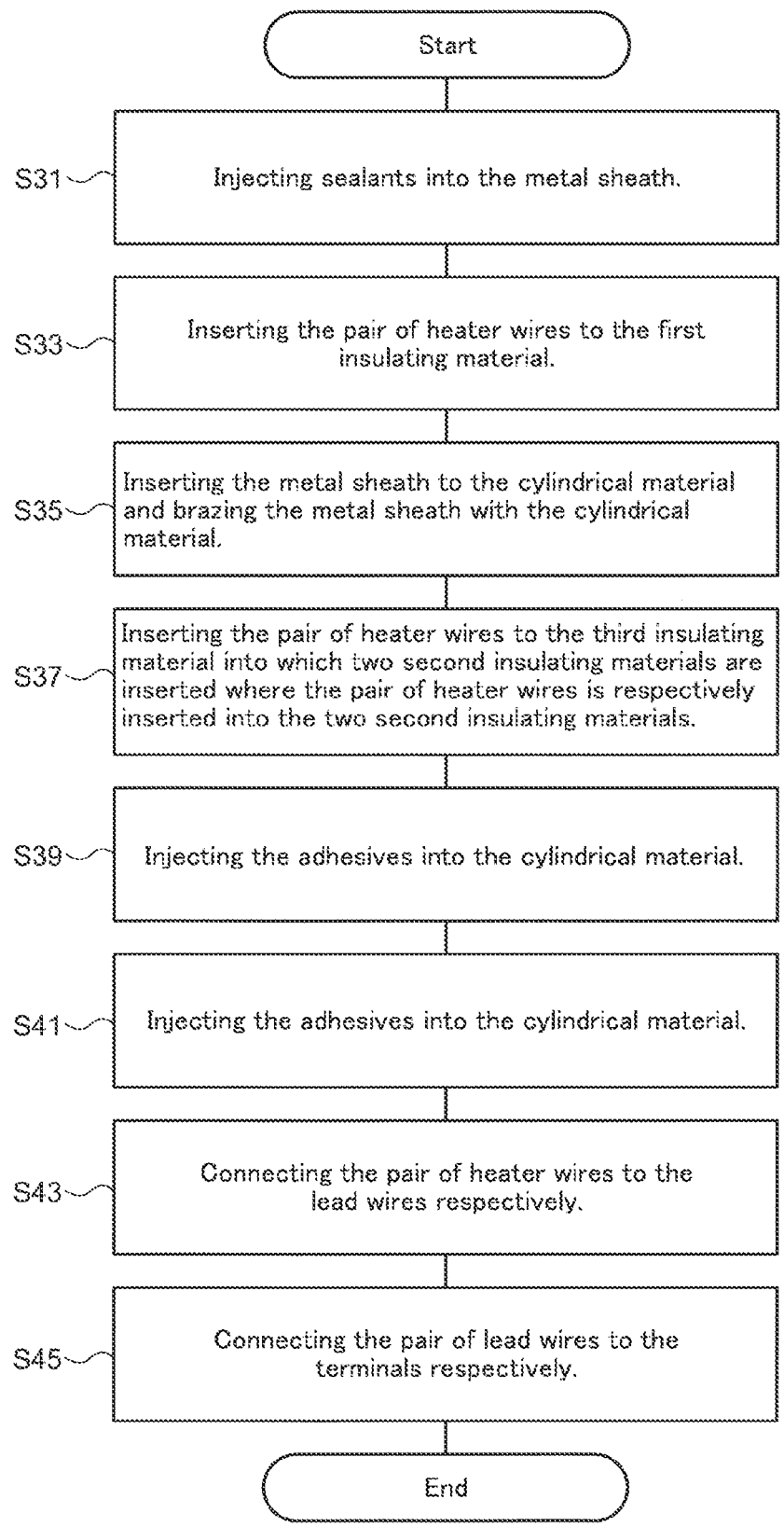
FIG. 4 is a diagram showing a flowchart for explaining a method of fabricating a heater according to an embodiment of the present invention.

Next, as shown in FIG. 3A and step 37 (S37) of FIG. 4, both ends of the heater wire 118 are inserted into the third insulating member 138 into which two second insulating members 128 are inserted. Specifically, one of the both ends of the heater wire 118 is inserted into the second insulating member 128a inserted into the third insulating member 138, and the other one of the both ends of the heater wire 118 is inserted into the second insulating member 128b inserted into the third insulating member 138. In the present embodiment, as the second insulating members 128 and the third insulating member 138, insulating tubes formed of polyimides are used. Further, as the second insulating member 128, an insulating tube having an outer diameter d7 of approximately 2 mm was used, whereas an insulating tube having an outer diameter d8 of approximately 4 mm is used as the third insulating member 138 was used.

Figure 3B:
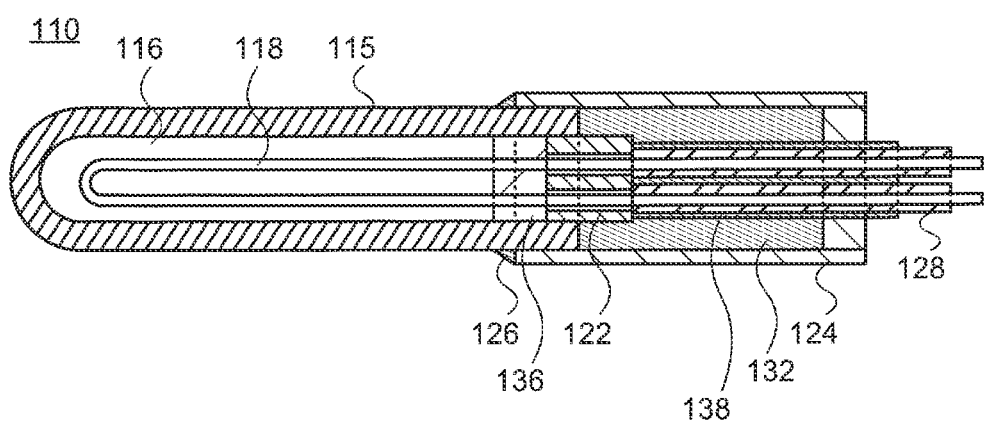
FIG. 3B is a cross-sectional view showing a method for fabricating a heater according to an embodiment of the present invention.

Next, as shown in FIG. 3B and step 39 (S39) of FIG. 4, the third insulator 132 is inserted into the cylindrical member 124. In this embodiment, as the third insulator 132, a ceramic-based adhesive is used.

Figure 3C:
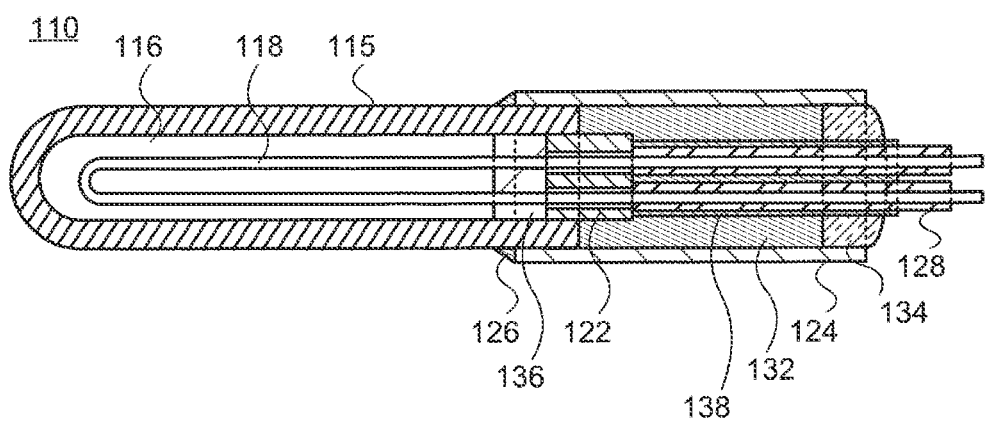
FIG. 3C is a cross-sectional view showing a method for fabricating a heater according to an embodiment of the present invention.

Next, as shown in FIG. 3C and step 41 (S41) of FIG. 4, the fourth insulator 134 is inserted into the cylindrical member 124. In this embodiment, as the fourth insulator 134, a fluorine-based adhesive is used. The fourth insulator 134 covers the third insulator 132 and is provided so as to surround the second insulating members 128.

Furthermore, as shown in FIG. 1A and step 43 (S43) of FIG. 4, the pair of leads 112 is connected to both ends of the heater wire 118. Finally, as shown in FIG. 1A and step 45 (S45) of FIG. 4, the pair of terminals 114 are connected to the pair of leads 112.

The sheath heater 110 is fabricated as explained above. Note that, the fabrication method of the sheath heater 110 explained with reference to FIG. 1A, FIGS. 2A to FIG. 4 is merely an example, and the method is not limited to this example. As the method for fabricating the sheath heater 110, an appropriately selected method may be employed within a range not from the configuration of the sheath heater 110 according to an embodiment of the present invention.

By manufacturing the sheath heater 110 as described above, the sheath heater 110 can be formed to be thin.

2. Second Embodiment

In the present embodiment, the stage 100 according to an embodiment of the present invention will be described. Description of the same or similar configuration as that of the first embodiment may be omitted.

Figure 5A:
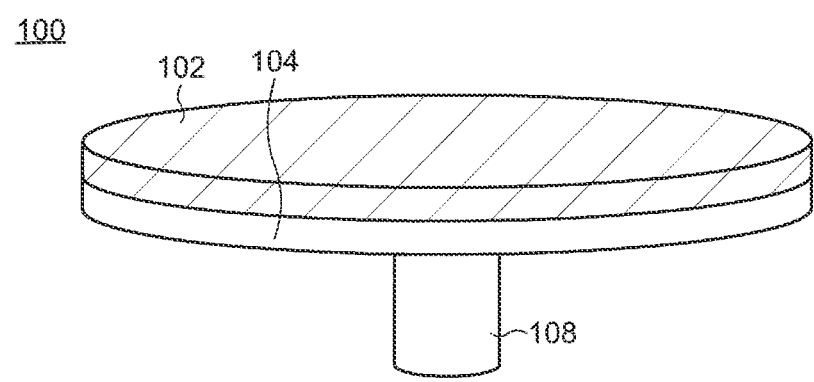
FIG. 5A is a perspective view showing a configuration of a stage according to an embodiment of the present invention.
Figure 5B:
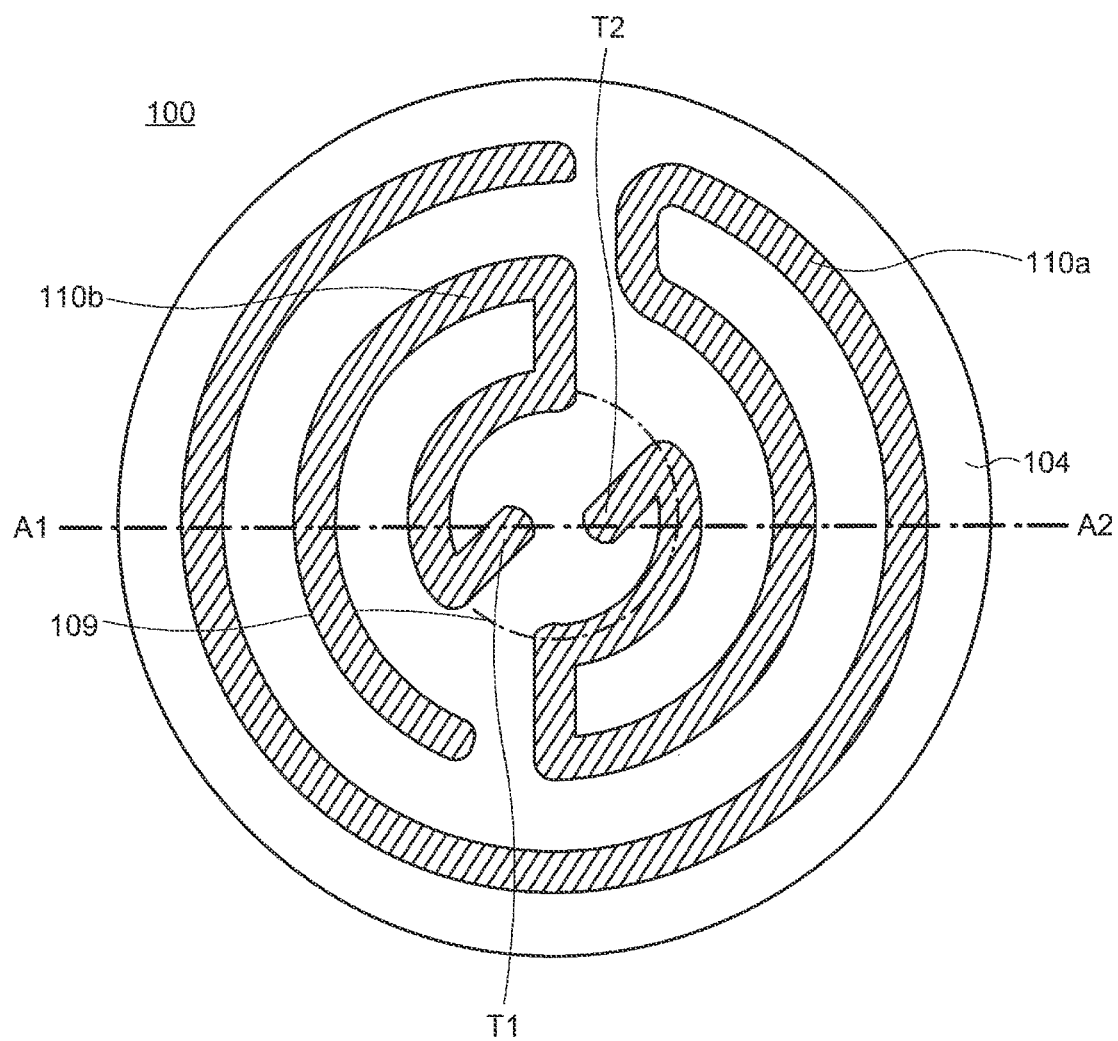
FIG. 5B is a top view showing a configuration of a stage according to an embodiment of the present invention.
Figure 6A:
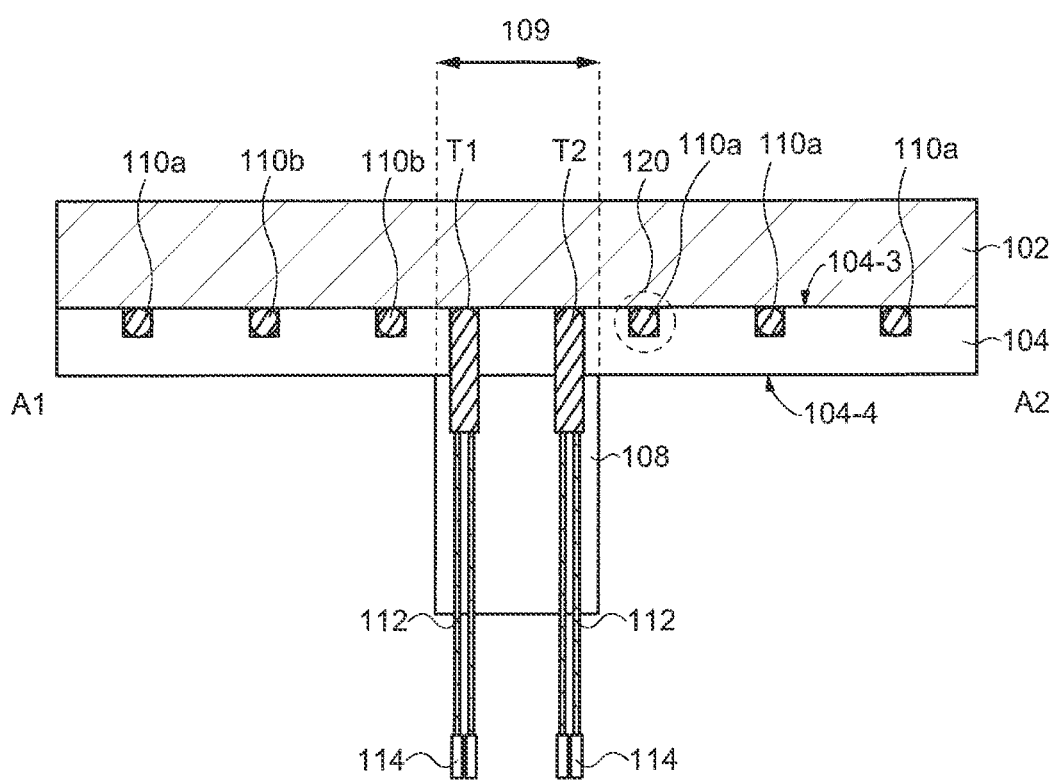
FIG. 6A is a cross-sectional view showing a configuration of a stage according to an embodiment of the present invention.
Figure 6B:
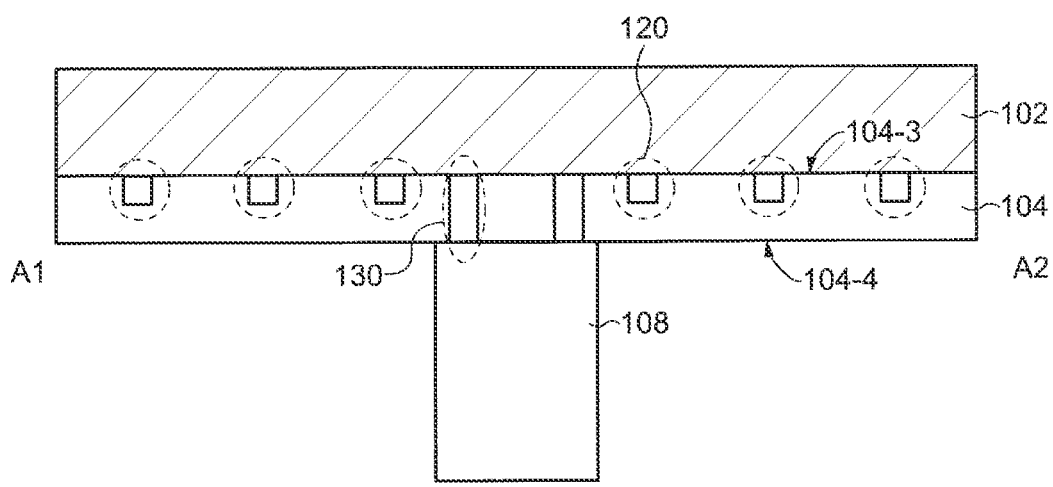
FIG. 6B is a cross-sectional view showing a configuration of a stage according to an embodiment of the present invention.

FIG. 5A and FIG. 5B show perspective and top views of stage 100, respectively. FIG. 6A and FIG. 6B show cross-sectional views along a chain line A1-A2 of FIG. 5B. As shown in FIG. 5A to FIG. 6B, stage 100 has the first support plate 102, the second support plate 104, a shaft 108, and at least one sheath heater 110. In FIG. 5A to FIG. 6B, an example is demonstrated in which two sheath heaters of the first sheath heater 110a and the second sheath heater 110b are provided. Considering the visibility of the drawings, the illustration of the first support plate 102 is omitted in FIG. 5B, and the illustration of the sheath heater 110 is omitted in FIG. 6B.

The first support plate 102 is configured so that the top surface is flat for placing a semiconductor substrate containing silicon or a compound semiconductor, an insulating substrate containing an insulator such as quartz or glass, or the like thereon. The first support plate contains a metal selected from metals having a thermal conductivity of 200 W/mK or more and 430 W/mK or less. By using a metal having a high thermal conductivity, it is possible to efficiently receive the thermal energy generated by the sheath heater 110. Further, it is preferable that the metal has a thermal expansion coefficient of $5\times10^{-6}$/K or more and $25\times10^{-6}$/K or less. Specific metals satisfying such properties include metals such as titanium, aluminum, and stainless steel. Although not shown, on the first support plates 102 may be provided electrostatic chucks for fixing the substrate, a through hole for supplying a gas having a high thermal conductivity, such as helium, between the substrate and the stage 100, or an annular flow path for circulating a liquid medium.

The second support plate 104 is provided below the first support plate 102. The second support plate 104 also includes a metal usable in the first support plate 102. The metal included in the second support plate 104 and the metal included in the first support plate 102 may be the same or different. When these metals are different, these metals can be selected such that the difference in the thermal expansion coefficient of the metals included in the first support plate 102 and the second support plate 104 is $10\times10^{-6}$/K or less. Thus, it is possible to suppress deformation due to thermal expansion, thereby providing the highly reliable stage 100.

The upper surface 104-3 of the second support plate 104 is bonded to the first support plate 102. The first support plate 102 and the second support plate 104 may be bonded by welding, screwing, or brazing. Brazes used in brazing include silver, copper, and alloys containing zinc, alloys containing copper and zinc, copper containing a trace amount of phosphorus, aluminum and alloys thereof, alloys containing titanium, copper, and nickel, alloys containing titanium, zirconium, and copper, alloys containing titanium, zirconium, copper, and nickel, and the like.

Note that the stage 100 may further have a third support plate (not shown). The third support plate, which is an optional configuration, is provided below the second support plate 104. The third support plate includes a configuration similar to the first support plate 102 or the second support plate 104. The third support plate is bonded to the lower surface 104-4 of the second support plate 104. Similar to the bonding of the first support plate 102 and the second support plate 104, the bonding of the third support plate and the second support plate 104 can also be performed by welding, screwing, brazing, or the like.

The shaft 108 is provided for supporting the first support plate 102 and the second support plate 104. To store the lead wire 112 for supplying power to the heater wire 118 of the sheath heater 110 described later, the shaft 108 has a hollow structure. When an electrostatic chuck is provided, wiring for supplying power to the electrostatic chuck is also provided within the shaft 108. Although not shown for clarity of the drawings, the shaft 108 may be connected to a rotating mechanism. By connecting the shaft 108 with the rotating mechanism, the stage 100 can be rotated about the long axis of the shaft 108. The shaft 108 is bonded to the second support plate 104 by welding, screwing, brazing, or the like. When the third support plate is used, the shaft 108 is bonded to the third support plate and also supports the third support plate.

The configuration described in the first embodiment can be applied to the sheath heater 110. The sheath heater 110 has a function of generating heat by energizing. The sheath heater 110 is provided to heat the second support plate 104 and the first support plate 102. With this structure, the substrate placed on the stage 100 is heated.

The upper surface 104-3 of the second support plate 104 is provided with a groove (first groove 120) (FIG. 6B), and the first sheath heater 110a and the second sheath heater 110b are provided in the first groove 120 (FIG. 6A). In the examples shown in FIG. 6A and FIG. 6B, the first support plate 102 has a flat lower surface, and the groove is not provided on the lower surface. Therefore, the depth of the first groove 120 is the same as or substantially identical to the outer diameter of the sheath heater 110. Specifically, the depth of the first groove 120 may be greater than 100% of the outer diameter of the sheath heater 110 and equal to or less than 150%, greater than 100% and equal to or less than 120%, or greater than 100% and equal to or less than 110% of the outer diameter of the sheath heater 110. To reduce the in-plane temperature distribution of the first support plate 102, the first groove 120 is formed to be present at a uniform density on the top surface 104-3.

The first end portion T2 of the first sheath-heater 110a is located in a region (region indicated by a dashed circle in FIG. 5B) 109 where the first support plate 102 and the second support plate 104 overlap the shaft 108. The first sheath heater 110a bent at the first end portion T2 passes through a through hole 130 (shown in FIG. 6B) formed in the second support plate 104, extends into the shaft 108, and is connected to a heater power supply (not shown) via the lead wire 112 and the terminal 114.

Similar to the first end portion T1 of the first sheath heater 110a, the first end portion T1 of the second sheath heater 110b is also located in the region (region indicated by the dashed circle in FIG. 5B) 109 where the first support plate 102 and the second support plate 104 overlap the shaft 108. The second sheath heater 110b bent at the first end portion T1 passes through the through hole 130 (FIG. 6B) formed in the third support plate 106, extends into the shaft 108, and is further connected to the heater power supply (not shown) via the lead wire 112 and the terminal 114 (FIG. 6A).

By applying the configuration described above, it is possible to not only greatly improve the flexibility of the layout of the sheath heater, but also perform more uniform substrate heating.

As described in the first embodiment, the diameter of the conventional sheath heater is thicker than the diameter of the sheath heater 110 provided in the stage 100 according to the embodiment of the present invention. Due to the limitations on the size of the shaft 108 included in the stage, it is difficult to place the end portions of a plurality of sheath heaters in the region 109 when a large number of sheath heaters is used in the stage. As a result, the number of sheath heaters that can be arranged is limited. Therefore, it is impossible to divide the upper surface of the stage into a plurality of segments and to precisely perform temperature control for each segment. Therefore, it is difficult to uniformly heat the substrate.

In contrast, the diameter of the sheath heater 110 provided in the stage 100 according to an embodiment of the present invention is thin. Thus, even when placing a plurality of sheath heaters 110 in the stage 100, it is possible to place the end portions of the plurality of sheath heaters in region 109. Further, the degree of freedom of arrangement of the large number of sheath heaters 110 is high, by which the upper surface of the stage can be divided into a plurality of segments and precise temperature control can be performed for each segment. Therefore, it is possible to uniformly heat the substrate.

3. Third Embodiment

In the present embodiment, a modification of the stage 100 described in the second embodiment will be described with reference to FIG. 7A and FIG. 7B. These figures are cross-sectional views along the dashed lines A1-A2 in FIG. 5B, as in the FIG. 6A. Description of the same or similar configuration as that of the first embodiment or the second embodiment may be omitted.

3-1. Modification 1

Figure 7A:
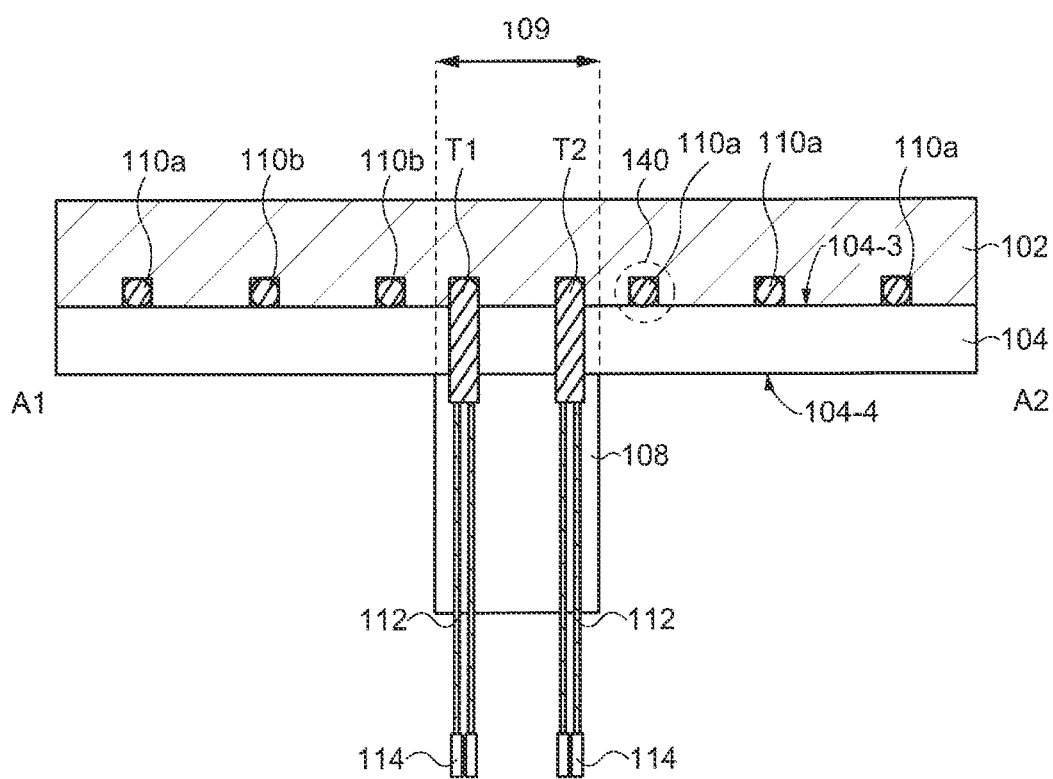
FIG. 7A is a cross-sectional view showing a configuration of a stage according to an embodiment of the present invention.

As shown in FIG. 7A, in modification 1, the groove (first groove 120) is not formed on the upper surface 104-3 of the second support plate 104, and the groove (second groove 140) is formed on the lower surface of the first support plate 102. In the modification 1, the sheath heater 110 is accommodated in the second groove 140. The depth of the second groove 140 is the same as or substantially identical to the outer diameter of the sheath heater 110. Specifically, the depth of the second groove 140 may be greater than 100% and equal to or less than 150%, greater than 100% and equal to or less than 120%, or greater than 100% and equal to or less than 110% of the outer diameter of the sheath heater 110.

In the modification 1, the contact area of the sheath heater 110 and the first support plate 102 can be increased by making the depth of the second groove 140 the same as or substantially identical to the outer diameter of the sheath heater 110. Therefore, it is possible to efficiently transfer the thermal energy generated by the sheath heater 110 to the first support plate 102.

In the modification 1, although a configuration is exemplified in which the depth of the second groove 140 is the same or substantially the same as the outer diameter of the sheath heater 110, the depth of the second groove 140 is not limited thereto. For example, the outer diameter of the sheath heater 110 and the depth of the second groove 140 may be different. If there is a space between the sheath heater 110 and the second groove 140, it is possible to suppress deformation due to thermal expansion of the sheath heater 110. Therefore, a highly reliable stage can be provided.

3-2. Modification 2

Figure 7B:
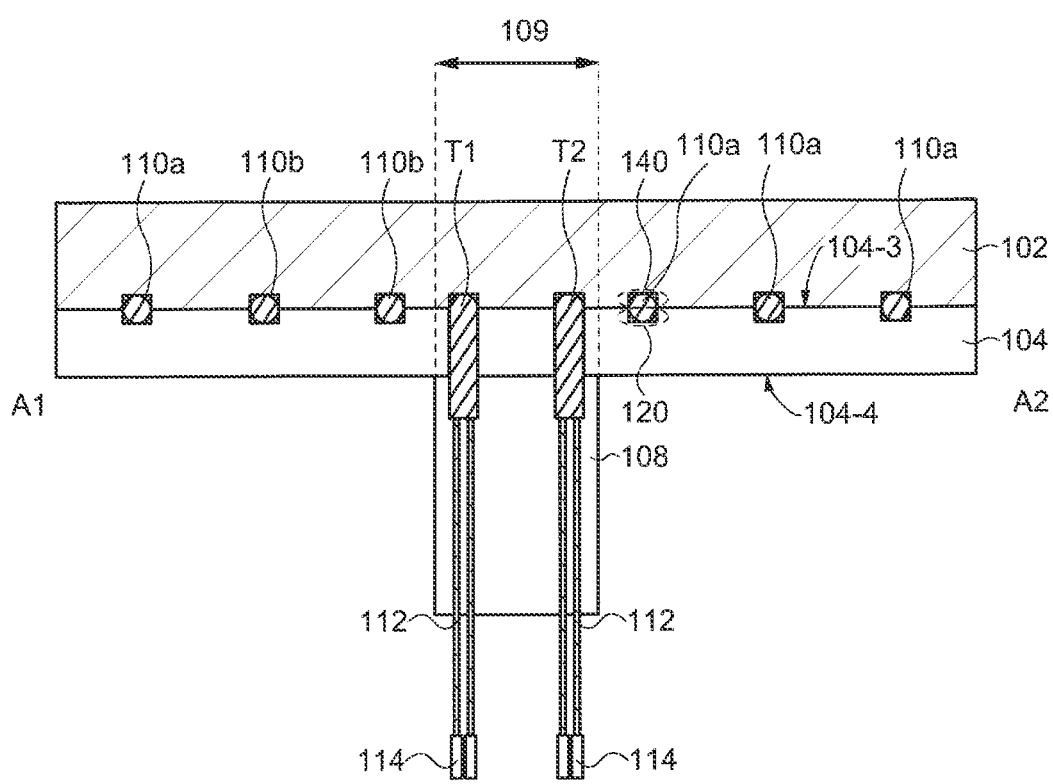
FIG. 7B is a cross-sectional view showing a configuration of a stage according to an embodiment of the present invention.

As shown in FIG. 7B, the first groove 120 may be formed on the upper surface 104-3 of the second support plate 104, and the second groove 140 may be formed on the lower surface of the first support plate 102. In the modification 2, the sum of the depth of the first groove 120 and the depth of the second groove 140 is the same or substantially the same as the outer diameter of the sheath heater 110. Specifically, the sum of the depth of the first groove 120 and the depth of the second groove 140 may be greater than 100% and equal to or less than 150%, greater than 100% and equal to or less than 120%, or greater than 100% and equal to or less than 110% of the outer diameter of the sheath heater 110.

In the modification 2, the contact area of the sheath heater 110 and the first support plate 102 and the second support plate 104 can be increased by making the sum of the depth of the first groove 120 and the depth of the second groove 140 the same or substantially the same as the outer diameter of the sheath heater 110. Therefore, it is possible to efficiently transfer the thermal energy generated by the sheath heater 110 to the first support plate 102 and the second support plate 104.

In the modification 2, although a configuration is exemplified in which the sum of the depth of the first groove 120 and the depth of the second groove 140 is the same as or substantially the same as the outer diameter of the sheath heater 110, the sum of the depth of the first groove 120 and the depth of the second groove 140 is not limited thereto. For example, the outer diameter of the sheath heater 110 and the sum of the depth of the first groove 120 and the depth of the second groove 140 may be different. If there is a space between the sheath heater 110 and the first groove 120 and the second groove 140, it is possible to suppress deformation due to thermal expansion of the sheath heater 110. Therefore, a highly reliable stage can be provided.

4. Fourth Embodiment

In this embodiment, a stage 150 on which a plurality of independently driven sheath heaters 110 is provided will be described. The embodiment shown below is an example of the present embodiment, and there is no limitation to the number of sheath heaters 110 provided on the stage 100.

Descriptions of the same or similar components as those of the first to third embodiments may be omitted.

Figure 8:
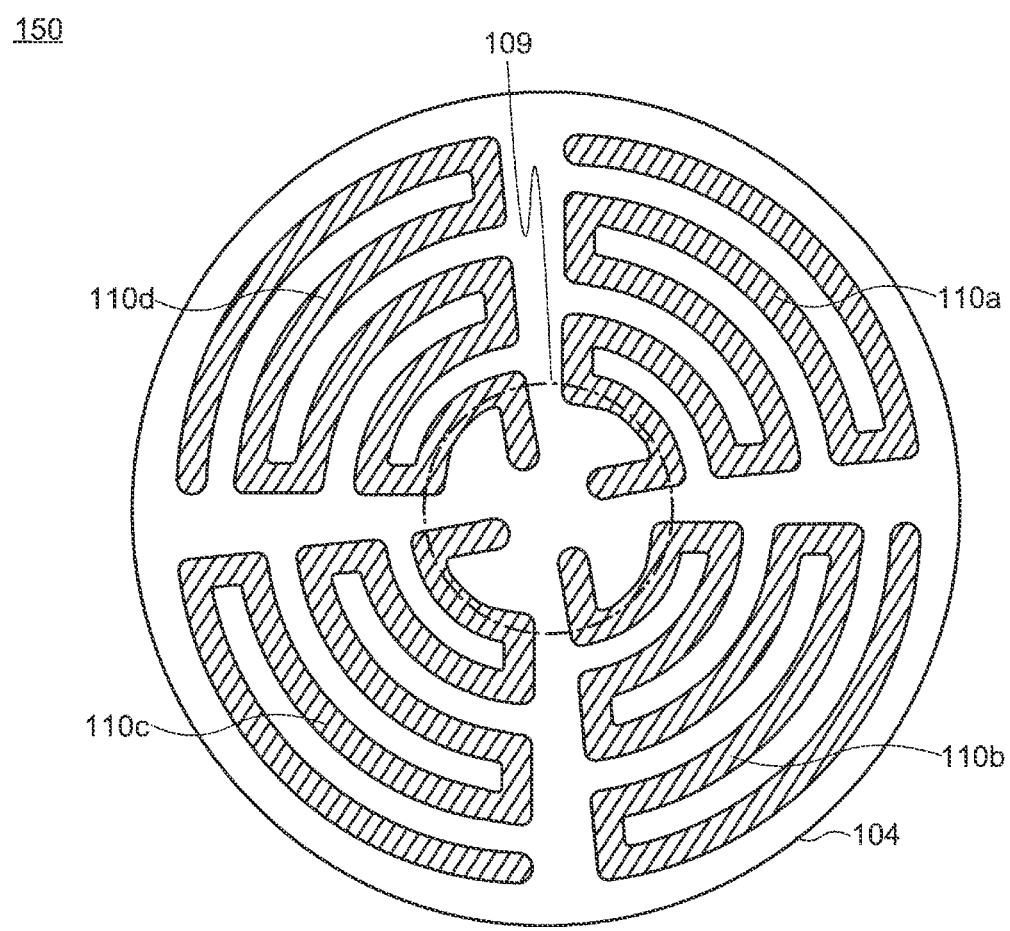
FIG. 8 is a top view showing a configuration of a stage according to an embodiment of the present invention.

FIG. 8 shows a top view of the stages 150. For the sake of clarity, the first support plate 102 is not shown in FIG. 8. As shown in FIG. 8, four sheath heaters (a first sheath heater 110a, a second sheath heater 110b, a third sheath heater 110c, and a fourth sheath heater 110d) are provided in one quadrant of the stage 150, respectively. That is, four sheath heaters, (the first sheath heater 110a, the second sheath heater 110b, the third sheath heater 110c, and the fourth sheath heater 110d) are provided on the stage 150 with high symmetry. In the example shown in FIG. 8, the first sheath heater 110a to the fourth sheath heater 110d having circular arcs with different radii are arranged.

The first sheath heater 110a to the fourth sheath heater 110d have the same shape and are arranged so that, when one of the first sheath heater 110a to the fourth sheath heater 110d is rotated 90° about an axis passing through the center of the second support plate 104, this sheath heater overlaps with the other one of the sheath heaters.

Even when the layout described above is adopted, since the diameters of the plurality of sheath heaters 110 provided in the stage 150 according to an embodiment of the present invention are small, it is possible to place the end portions of the plurality of sheath heaters 110 in the region 109. Moreover, by adopting the layout described above, the plurality of sheath heaters 110 can be highly symmetrically placed on the second support plate 104 at a high density. Thus, the temperature of the substrate can be controlled more uniformly and precisely.

5. Fifth Embodiment

In the present embodiment, a structure of the sheath heater 110 different from that of the first embodiment will be described. Description of the same or similar configuration as that of the first embodiment may be omitted.

Figure 9A:
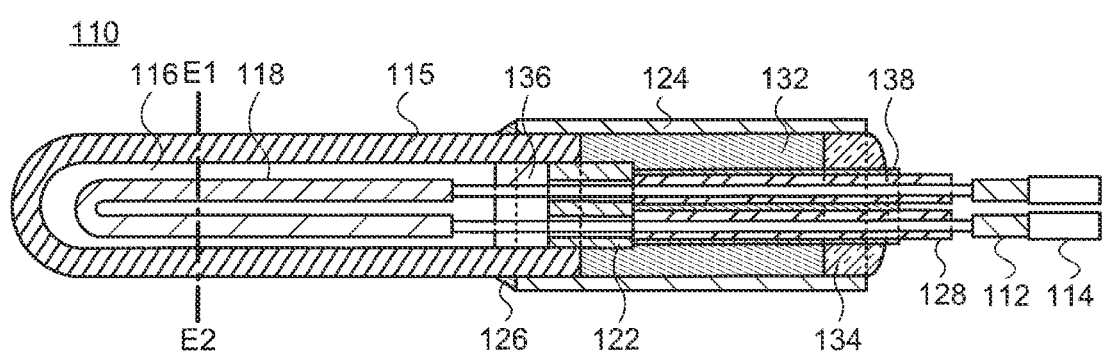
FIG. 9A is a cross-sectional view showing a configuration of a heater according to an embodiment of the present invention.
Figure 9B:
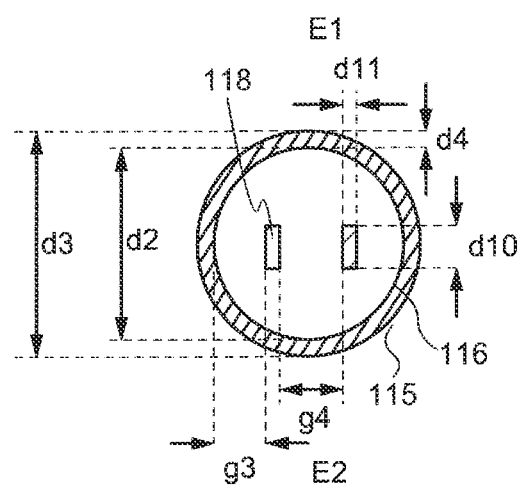
FIG. 9B is a cross-sectional view showing a configuration of a heater according to an embodiment of the present invention.

There is no limitation to the sheath heater 110 that can be used in the stage 100 according to the present embodiment, and the sheath heater 110 having various structures can be used. As an example, a cross-sectional view of a mono-terminal type sheath heater 110 with a stripe-shaped heater wire 118 is shown in FIG. 9A. FIG. 9B shows a cross-sectional view along a dashed line E1-E2 perpendicular to the long axis. FIG. 10A shows a cross-sectional view of the mono-terminal type sheath heater 110 with a stripe-shaped heater wire 118 having a spiral structure. FIG. 10B is a diagram showing a cross-sectional view along a chain line F1-F2 perpendicular to the long axis. FIG. 11A shows a cross-sectional view of the mono-terminal type sheath heater 110 with a stripe-shaped heater wire 118 having a double helix structure. FIG. 11B is a diagram showing a cross-sectional view along a chain line G1-G2 perpendicular to the long axis.

The sheath heater 110 shown in FIG. 9A differs from the sheath heater 110 shown in the first embodiment in that the stripe-shaped heater wire 118 is folded in the metal sheath 115 and that both ends thereof are taken out from one end of the metal sheath 115.

The cross-sectional shape of the sheath heater 110 illustrated in FIG. 9A is square, giving the stripe-shaped heater wires 118. As shown in FIG. 10A, the heater wire 118 is twisted in the metal sheath 115, where a portion from the folded portion to one end portion and a portion from the folded portion to the other end portion may each form a spiral structure independently. When the stripe-shaped heater wire 118 has a spiral structure, the spiral structure is adjusted so that the pitch L1 of the spiral is 1.0 mm or more and 3.0 mm or less, 1.0 mm or more and 2.5 mm or less, or 1.0 mm or more and 2.0 mm or less. By applying such a spiral structure, resistance of the sheath heater 110 can be increased by increasing the length of the heater wire 118 per unit length of the metal sheath 115. Furthermore, since it is possible to impart a spring property to the heater wire 118, disconnection during deformation and thermal expansion of the heater wire 118 is suppressed. Therefore, for example, even if the difference in thermal expansion coefficient between the metal sheath 115 and the heater wire 118 is large, it is possible to provide the sheath heater 110 with improved reliability.

As shown in FIG. 9B and FIG. 10B, the normal line of the heater wire 118 is substantially perpendicular to the direction in which the metal sheath 115 extends. Furthermore, in two portions of the heater wire 118 facing each other, the surface of the heater wire 118 is substantially parallel. Further, it is possible to maintain the distance g4 between the two portions of the heater wire 118 facing each other by setting the spiral direction of the spiral structure to be the same and adjusting the pitch L1 to also be substantially the same. As a result, it is possible to prevent a short circuit of the heater wire 118. However, the winding direction or pitches L1 of the spirals may be different from each other between the two portions of the heater wire 118 facing each other.

As shown in FIG. 11A, the heater wire 118 may be configured so that the two opposing portions of the heater wire 118 have a double helix structure. In this case, the heater wire 118 can be configured so that the pitch L2 of the spiral structure of the heater wire 118 is 1.0 mm or more and 6.0 mm or less, 1.0 mm or more and 2.5 mm or less, or 1.0 mm or more and 2.0 mm or less.

Referring to FIG. 9B, FIG. 10B, and FIG. 11B, the width d10 of the heater wire 118 can be selected from the range of 0.1 mm or more and 2.0 mm or less, and the thickness d11 can be selected from the range of 0.1 mm or more and 0.5 mm or less. The inner diameter d2 of the metal sheath 115 may be selected from the range of 3.0 mm or more and 4.0 mm or less, the thickness d4 may be selected from the range of 0.5 mm or more and 1.0 mm or less, and the outer diameter d3 may be selected from the range of 3.0 mm or more and 6.0 mm or less. The distance g3 between the heater wire 118 and the metal sheath 115 can be selected from the range of 0.3 mm or more and 1.0 mm or less, or 0.4 mm or more and 1.0 mm or less. The distance g4 between the portion from the folded portion to one end portion of the heater wire 118 and the portion from the folded portion to the other end portion is selected from the range of 0.3 mm or more 2.0 mm or less or 0.4 mm or more 1.0 mm or less. As a result, the sheath heater 110 can be formed thinner. Thus, it is possible to place the sheath heater 110 on the stage 100 with a high density. Therefore, it is possible to further reduce the temperature distribution of the substrate. Further, it is possible not only to ensure the insulation between the metal sheath 115 and the heater wire 118 but also to prevent a short circuit of the heater wire 118.

There is no limitation to the shape of the cross section perpendicular to the long axis of the sheath heater 110. For example, the shape of the cross section perpendicular to the long axis of the sheath heater 110 may be a circular shape as shown in FIG. 1B and may be a polygonal shape or elliptical shape although not illustrated. When the cross-sectional shape is circular, the force required for deformation does not depend on the direction of bending so that the sheath heater 110 can be readily bent in any direction. Therefore, it is possible to readily place the sheath heater 110 in the grooves formed in the first support plate 102 and the second support plate 104 as shown in FIG. 5 to FIG. 8.

6. Sixth Embodiment

In the present embodiment, a film forming apparatus and a film processing apparatus including the stage 100 or the stage 150 described above will be described. In the present embodiment, a film forming apparatus and a film processing apparatus provided with the stage 100 will be described as an example. Description of the same and similar configurations as those of the first to fifth embodiments may be omitted.

6-1. Etching Device

Figure 12:
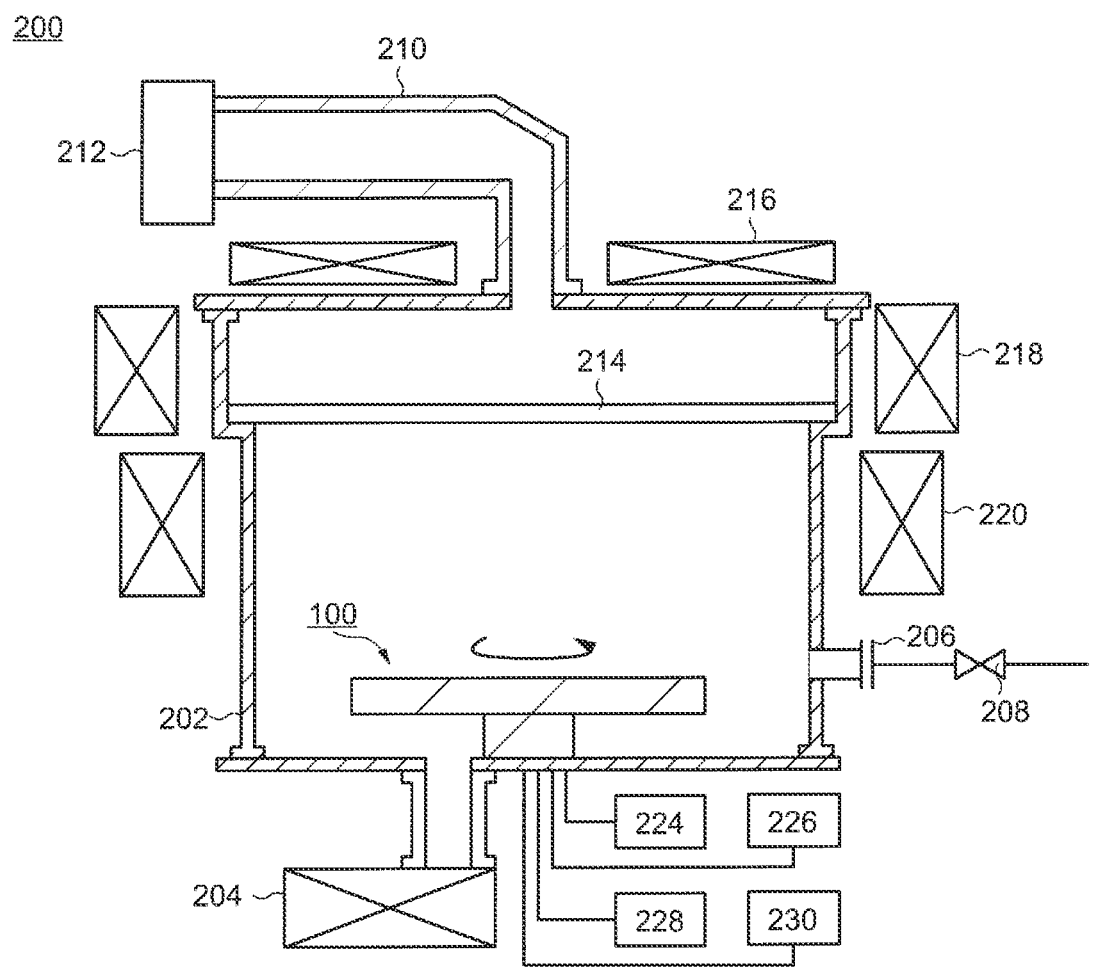
FIG. 12 is a schematic cross-sectional view of a film processing apparatus including a stage according to an embodiment of the present invention.

In FIG. 12, a cross-sectional view of an etching device 200 which is one of the film processing devices is shown. The etching device 200 can perform dry etching on various films. The etching device 200 includes a chamber 202. The chamber 202 provides a space for etching a film of a conductor, an insulator, a semiconductor, or the like formed on the substrate.

An exhaust device 204 is connected to the chamber 202 so that the interior of the chamber 202 can be set to a reduced-pressure atmosphere. The chamber 202 is further provided with an introduction pipe 206 for introducing a reaction gas, and the reaction gas for etching is introduced into the chamber through a valve 208. Examples of the reactive gases include a fluorine-containing organic compound such as carbon tetrafluoride ($CF_4$), octafluorocyclobutane ($c\text{-}C_4F_6$), decafluorocyclopentane ($c\text{-}C_5F_{10}$), and hexafluorobutadiene ($C_4F_6$).

A microwave source 212 may be provided at the top of the chamber 202 via a waveguide 210. The microwave source 212 includes an antenna for supplying microwaves, and outputs high-frequency microwaves such as 2.45 GHz microwaves and 13.56 MHz radio waves. The microwaves generated at the microwave source 212 are transferred to the top of the chamber 202 by the waveguide 210 and are introduced into the chamber 202 through a window 214 containing quartz, ceramic, or the like. The reaction gas is converted into plasmas by the microwave, and etching of the film proceeds by electrons, ions, and radicals contained in the plasma.

In order to install a substrate on a lower portion of the chamber 202, the stage 100 according to an embodiment of the present disclosure is provided. The substrate is placed on stages 100. A power supply 224 is connected to the stage 100 and a high frequency power is provided to the stage 100, by which a microwave electric field in a direction perpendicular to the substrate surface is formed on the surface of the stage 100. Further, a magnet 216, a magnet 218, and a magnet 220 can be provided on the top and side of the chamber 202. The magnet 216, the magnet 218, and the magnet 220 may be a permanent magnet, or an electromagnet having an electromagnetic coil. The magnet 216, the magnet 218 and the magnet 220 create magnetic field components parallel to the stage 100 and the substrate surfaces, and by the conjunction of electric fields generated by microwaves, the electrons in the plasmas resonate under the Lorentz force and are bound to the stage 100 and the substrate surface. As a result, high-density plasmas can be generated on the substrate surface.

Further, a heater power supply 230 for controlling the sheath heater 110 provided on the stage 100 is connected to the stage 100. Further, as an optional configuration, a power supply 226 for an electrostatic chuck for fixing the substrate to the stage 100, a temperature controller 228 for controlling the temperature of the medium to be circulated inside the stage 100, and a rotating control device (not illustrated) for rotating the stage 100 can be connected to the stage 100.

As described above, the stage 100 according to the embodiment of the present invention is used in the etching device 200. By using the stage 100, the substrate can be uniformly heated and the heating temperature can be precisely controlled. Therefore, the etching device 200 enables uniform etching of the various films provided on the substrate.

6-2. CVD Device

Figure 13:
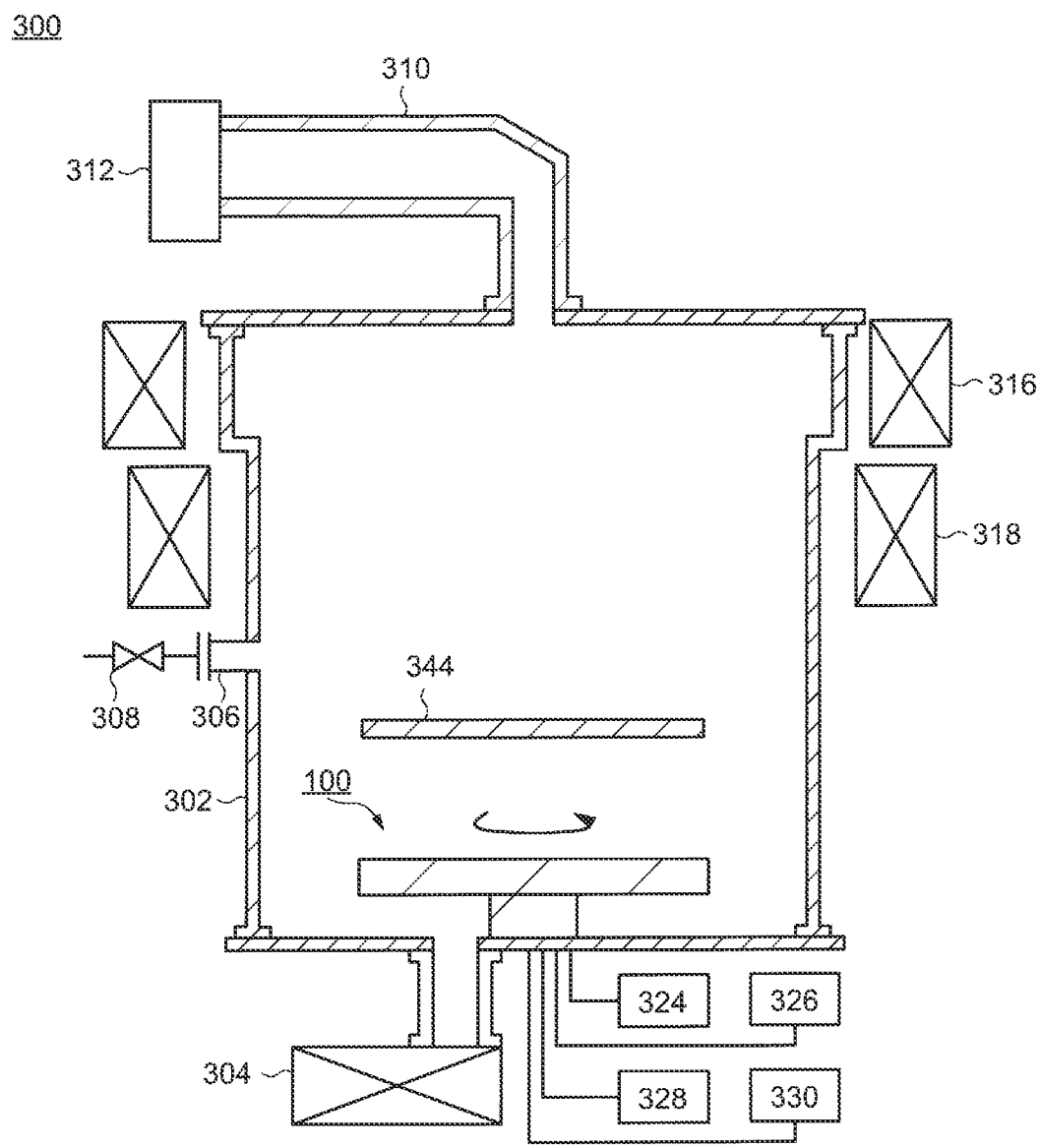
FIG. 13 is a schematic cross-sectional view of a film forming apparatus including a stage according to an embodiment of the present invention.

FIG. 13 shows a cross-sectional view of a CVD device 300 which is one of the film-forming devices. The CVD device 300 includes a chamber 302. The CVD device 300 provides a field for chemically reacting the reactant gases and chemically forming various films on the substrate.

An exhaust device 304 is connected to the chamber 302 to reduce the pressure in the chamber 302. The chamber 302 is further provided with an introduction pipe 306 for introducing a reaction gas, and the reaction gas for film formation is introduced into the chamber 302 through a valve 308. As the reaction gas, various gases can be used depending on the film to be produced. The gas may be liquid at room temperature. For example, by using silane, dichlorosilane, tetraethoxysilane, or the like, a thin film such as silicon, silicon oxide, or silicon nitride can be formed. Alternatively, by using tungsten fluoride, trimethylaluminum, or the like, a thin metal film of tungsten, aluminum, or the like can be formed.

Similar to the etching device 200, a microwave source 312 may be provided at an upper portion of the chamber 302 via a waveguide 310. Microwaves generated by the microwave source 312 are introduced into the chamber 302 by the waveguide 310. The reaction gas is converted into plasmas by microwaves, and the chemical reaction of the gas is accelerated by various active species contained in the plasmas, by which the products obtained by the chemical reaction are deposited on the substrate to form a thin film. Optionally, a magnet 344 may be provided in the chamber 302 to increase the density of the plasmas. The stage 100 described in the first embodiment is provided at a lower portion of the chamber 302, and thin films can be deposited while the substrate is placed on the stage 100. Similar to the etching device 200, the side of the chamber 302 may be further provided with a magnet 316 and a magnet 318.

A heater power supply 330 for controlling the sheath heater 110 provided on the stage 100 is further connected to the stage 100. Optionally, a power supply 324 for providing high frequency power to the stage 100, a power supply 326 for the electrostatic chucking, a temperature controller 328 for controlling the temperature of the medium recirculated into the stage 100, a rotating control device (not shown) for rotating the stage 100, and the like can be connected to the stage 100.

6-3. Sputtering Device

Figure 14:
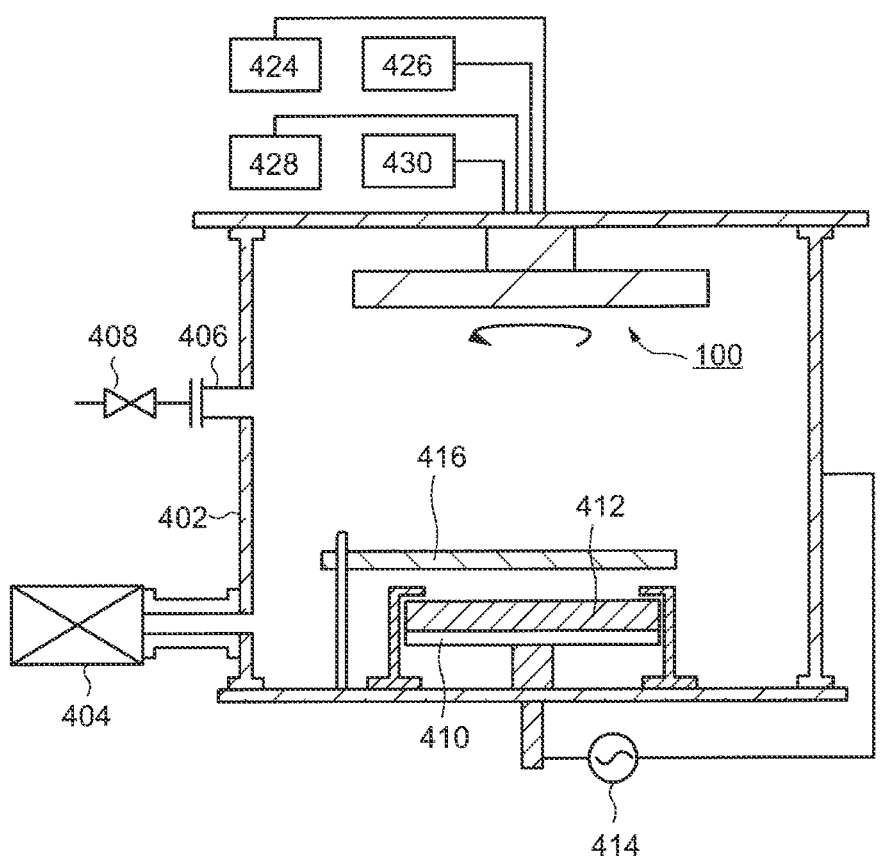
FIG. 14 is a schematic cross-sectional view of a film forming apparatus including a stage according to an embodiment of the present invention.

FIG. 14 shows a cross-sectional view of a sputtering device 400 which is one of the films forming devices. The sputtering device 400 includes a chamber 402. The sputtering device 400 provides a field for collisions between fast ions and targets, and for depositing the target atoms that are generated at that time on the substrate.

An exhaust device 404 for reducing the pressure in the chamber 402 is connected to the chamber 402. The chamber 402 is provided with an introduction tube 406 and a valve 408 for introducing a sputtering gas such as argon into the chamber 402.

A target stage 410 for holding a target containing a member to be deposited and functioning as a cathode is provided at a lower portion of the chamber 402 over which a target 412 is provided. A high-frequency power supply 414 is connected to the target stage 410, and plasma can be generated in the chamber 402 by the high-frequency power supply 414.

The stage 100 described in the first embodiment may be provided at an upper portion of the chamber 402. In this case, thin-film formation proceeds in a state where the substrate is placed underneath the stage 100. Similar to the etching device 200 and the CVD device 300, the heater power supply 430 is connected to the stage 100. A power supply 424 for providing a high frequency power to the stage 100, a power supply 426 for the electrostatic chucking, a temperature controller 428, and a rotating control device (not illustrated) for rotating the stage 100 can be connected to the stage 100.

Argon ions accelerated by the plasmas generated in the chamber 402 collide with the target 412, and atoms of the target 412 are ejected. The ejected atoms fly to and deposit on the substrate placed below the stage 100 while shutter 416 is open.

In the present embodiment, although a configuration is demonstrated in which the stage 100 is installed on the upper portion of the chamber 402 and the target stage 410 is installed at the lower portion of the chamber 40, the present embodiment is not limited to this configuration, and the sputtering device 400 may be configured so that the target 412 is positioned on the stage 100. Alternatively, the stage 100 may be installed so that the main surface of the substrate is positioned perpendicular to the horizontal plane, and the target stage 410 may be provided so as to face the substrate.

6-4. Deposition Device

Figure 15:
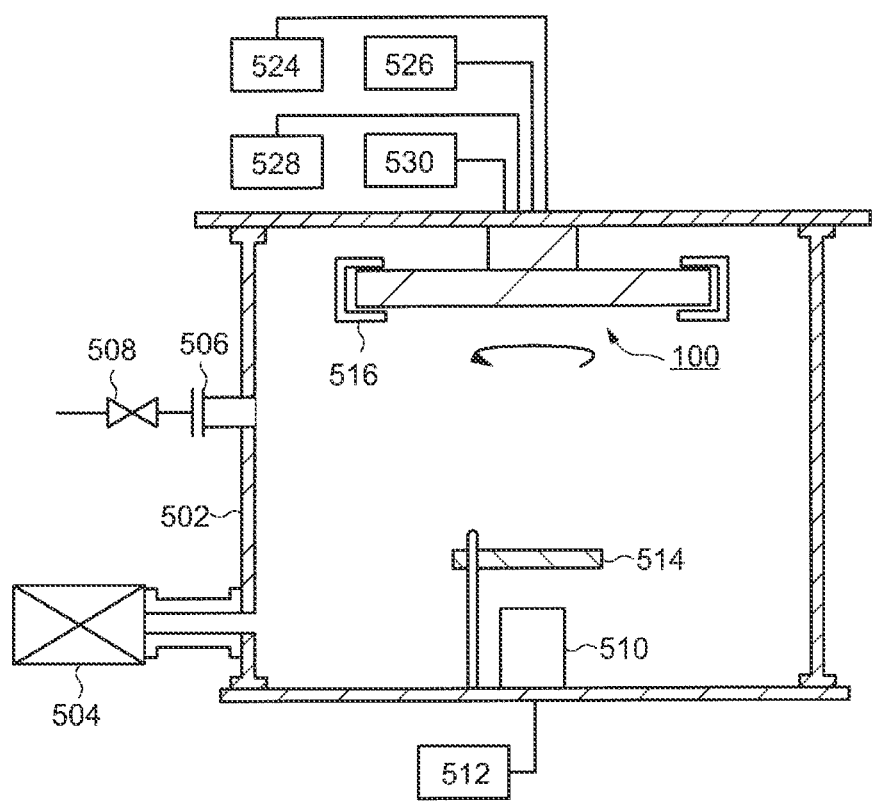
FIG. 15 is a schematic cross-sectional view of a film forming apparatus including a stage according to an embodiment of the present invention.

FIG. 15 shows a cross-sectional view of a deposition device 500 which is one of the films forming devices. The deposition device 500 includes a chamber 502. A space for the evaporation of the member at the deposition source 510 and for the deposition of the evaporated member on the substrate is provided by the chamber 502.

An exhaust device 504 for providing a high vacuum in the chamber 502 is connected to the chamber 502. The chamber 502 is provided with an introduction pipe 506 for returning the chamber 502 to atmospheric pressure, and an inert gas such as nitrogen or argon is introduced into the chamber 502 through a valve 508.

A stage 100 may be provided at an upper portion of the chamber 502. With the substrate placed underneath the state stage 100, the depositions of members proceed. Similar to the etching device 200, the CVD device 300, and the sputtering device 400, the heater power supply 528 is further connected to the stage 100. Optionally, a power supply 524 for the electrostatic chucking, a temperature controller 526, and a rotating control device 530 for rotating the stage 100 can be connected to the stage 100. The stage 100 may further include a mask holder 516 for fixing a metal mask between the substrate and the deposition source 510. This structure allows the metal mask to be placed in the vicinity of the substrate so that the opening portion of the metal mask overlaps the region where the member is to be deposited.

A deposition source 510 is provided on a lower side of the chamber, and the member to be deposited is charged into the deposition source 510. The deposition source 510 is provided with a heater for heating the member, and the heater is controlled by a control device 512. The evaporation is initiated by making the chamber 502 a highly vacuum state using the exhaust device 504 and heating the evaporation source 510 to vaporize the member. The deposition of the member on the substrate is initiated by opening the shutter 514 when the deposition speed is constant.

As described above, the stages according to an embodiment of the present invention are used in a film forming device such as the CVD device 300, the sputtering device 400, or the deposition device 500 of the present embodiment. By using these stages, it is possible to uniformly heat the substrate and precisely control the heating temperatures. Therefore, by using these film-forming devices, various films whose properties are controlled can be uniformly formed on the substrate.

Each of the embodiments described above as an embodiment of the present invention can be appropriately combined and implemented as long as no contradiction is caused. Further, the addition, deletion, or design change of components as appropriate by those skilled in the art based on each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:
1. A heater comprising:
 a folded heater wire which consists of one continuous piece;
 a first insulator provided on the folded heater wire;
 a metal sheath provided to be in contact with at least a part of the first insulator;
 a first insulating member arranged in parallel to at least a part of a first end of the folded heater wire taken out from a first end of the metal sheath;
 a second insulating member arranged in parallel to at least a part of the first insulating member and parallel to at least a part of a second end of the folded heater wire taken out from the first end of the metal sheath;
 a third insulating member arranged in parallel to at least a part of the first insulating member and the second insulating member, and provided to bundle the first insulating member and the second insulating member; and
 a cylindrical member arranged in parallel to at least a part of the metal sheath and the third insulating member,
 wherein
  the cylindrical member includes a first end and a second end opposite the first end of the cylindrical member, and
  the first insulating member, the second insulating member, and the third insulating member protrude from the second end of the cylindrical member
 wherein a length by which the first end of the folded heater wire and the second end of the folded heater wire protrude from the second end of the cylindrical member is longer than a length by which the first insulating member, the second insulating member and the third insulating member protrude from the second end of the cylindrical member.

2. The heater according to claim 1, wherein the cylindrical member has a predetermined thickness and is composed of one cylindrical element.

3. The heater according to claim 1, wherein an inner diameter of the cylindrical member is substantially the same as an outer diameter of the metal sheath.

4. The heater according to claim 1, further comprising;
a pair of lead wires, wherein
the pair of lead wires is connected to the first end of the folded heater wire and the second end of the folded heater wire.

5. The heater according to claim 1, wherein a shape of the folded heater wire is a stripe shape.

6. The heater according to claim 1, wherein the folded heater wire has a spiral structure.

7. The heater according to claim 1, wherein the folded heater wire has a double helix structure.

8. The heater according to claim 1, wherein a material of the metal sheath includes aluminum.

9. The heater according to claim 1, wherein the outer diameter of the metal sheath is 3.0 mm or more and 6.0 mm or less.

10. The heater according to claim 1, wherein a material of the cylindrical member includes aluminum.

11. The heater according to claim 1, wherein an outer diameter of the cylindrical member is 4.0 mm or more and 10.0 mm or less.

12. The heater according to claim 1, wherein the metal sheath includes a second end of the metal sheath opposite the first end of the metal sheath, and the folded heater wire is folded on the second end side of the metal sheath.

13. A heater comprising;
a folded heater wire which is consist of one continuous piece;
a first insulator provided on the folded heater wire;
a metal sheath provided to be in contact with at least a part of the first insulator;
a first insulating member arranged in parallel to at least a part of a first end of the folded heater wire taken out from a first end of the metal sheath;
a second insulating member arranged in parallel to at least a part of the first insulating member and parallel to at least a part of a second end of the folded heater wire taken out from the first end of the metal sheath;
a third insulating member arranged in parallel to at least a part of the first insulating member and the second insulating member, and provided to bundle the first insulating member and the second insulating member;
a cylindrical member arranged in parallel to at least a part of the metal sheath and the third insulating member; and
an insulating tube including a first through hole and a second through hole, wherein
a part of the metal sheath is a cylindrical shape and the insulating tube is arranged between the first insulator and the third insulating member along the cylindrical axis direction of the metal sheath, and
the first end of the folded heater wire is inserted through the first through hole and the second end of the folded heater wire is inserted through the second through hole
wherein each of the first insulating member, the second insulating member and the third insulating member is in contact with the insulating tube on a side where the third insulating member is arranged.

14. The heater according to claim 13, wherein the first through hole, the second through hole, at least part of the first end of the folded heater wire, and at least part of the second end of the folded heater wire are arranged in parallel.

15. A heater comprising:
a folded heater wire which is consist of one continuous piece;
a first insulator provided on the folded heater wire;
a metal sheath provided to be in contact with at least a part of the first insulator;
a first insulating member arranged in parallel to at least a part of a first end of the folded heater wire taken out from a first end of the metal sheath;
a second insulating member arranged in parallel to at least a part of the first insulating member and parallel to at least a part of a second end of the folded heater wire taken out from the first end of the metal sheath;
a third insulating member arranged in parallel to at least a part of the first insulating member and the second insulating member, and provided to bundle the first insulating member and the second insulating member; and
a cylindrical member arranged in parallel to at least a part of the metal sheath and the third insulating member;
wherein
the third insulating member includes a through hole, and
the first insulating member and the second insulating member are inserted into the through hole and contact the third insulating member within the through hole.

* * * * *